(12) United States Patent
Morishita

(10) Patent No.: US 10,103,914 B2
(45) Date of Patent: Oct. 16, 2018

(54) EQUALIZER CIRCUIT AND RECEIVING APPARATUS USING THE SAME

(71) Applicant: Panasonic Corporation, Osaka (JP)

(72) Inventor: Yohei Morishita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 15/384,063

(22) Filed: Dec. 19, 2016

(65) Prior Publication Data

US 2017/0187514 A1    Jun. 29, 2017

(30) Foreign Application Priority Data

Dec. 28, 2015 (JP) ................................. 2015-256999
Jul. 15, 2016 (JP) ................................. 2016-140332

(51) Int. Cl.
| | |
|---|---|
| *H04L 7/00* | (2006.01) |
| *H04L 27/01* | (2006.01) |
| *H04L 25/03* | (2006.01) |
| *H03D 7/14* | (2006.01) |
| *H03H 15/00* | (2006.01) |
| *H03H 19/00* | (2006.01) |

(52) U.S. Cl.
CPC ............. *H04L 27/01* (2013.01); *H04L 25/03* (2013.01); *H03D 7/1483* (2013.01); *H03H 15/00* (2013.01); *H03H 19/004* (2013.01); *H03H 2015/007* (2013.01)

(58) Field of Classification Search
CPC .... H03H 15/00; H03H 15/007; H03H 19/004; H03H 2015/007; H03D 7/1483; H04L 27/01; H04L 25/03
See application file for complete search history.

(56) References Cited

U.S. PATENT DOCUMENTS

| | | | | |
|---|---|---|---|---|
| 8,279,023 | B2 * | 10/2012 | Iida ..................... | H03H 19/004 333/167 |
| 2005/0233725 | A1 | 10/2005 | Muhammad et al. | |
| 2011/0199122 | A1 * | 8/2011 | Morishita ............. | H03H 15/023 327/2 |
| 2013/0222164 | A1 * | 8/2013 | Shiozaki ............... | H03H 15/00 341/122 |
| 2014/0362957 | A1 * | 12/2014 | Morishita ............. | H03D 7/125 375/347 |

FOREIGN PATENT DOCUMENTS

WO    WO2013/111565 A1 *   8/2013   ............. H03D 7/125

* cited by examiner

*Primary Examiner* — Sophia Vlahos
(74) *Attorney, Agent, or Firm* — Seed IP Law Group LLP

(57) ABSTRACT

An equalizer circuit includes an phase-to-phase connectors including an phase-to-phase capacitor and four phase-to-phase switches, four output buffers, and control signal generation circuitry. One terminal of each phase-to-phase switches is connected to one of four connection paths on which four conversion signals being different in phase by 90° are input. The other one terminal of each phase-to-phase switches is connected to the phase-to-phase capacitor. Each output buffer is connected to one of the four connection paths and outputs an output signal. The control signal generation circuitry outputs control signals to control turning-on/off of the respective four phase-to-phase switches. A closing of the first, second, third, and fourth phase-to-phase switches are started from any one of phase-to-phase switches in one of a first ascending circulation and a first descending circulation based on the 4-phase control signals.

6 Claims, 21 Drawing Sheets

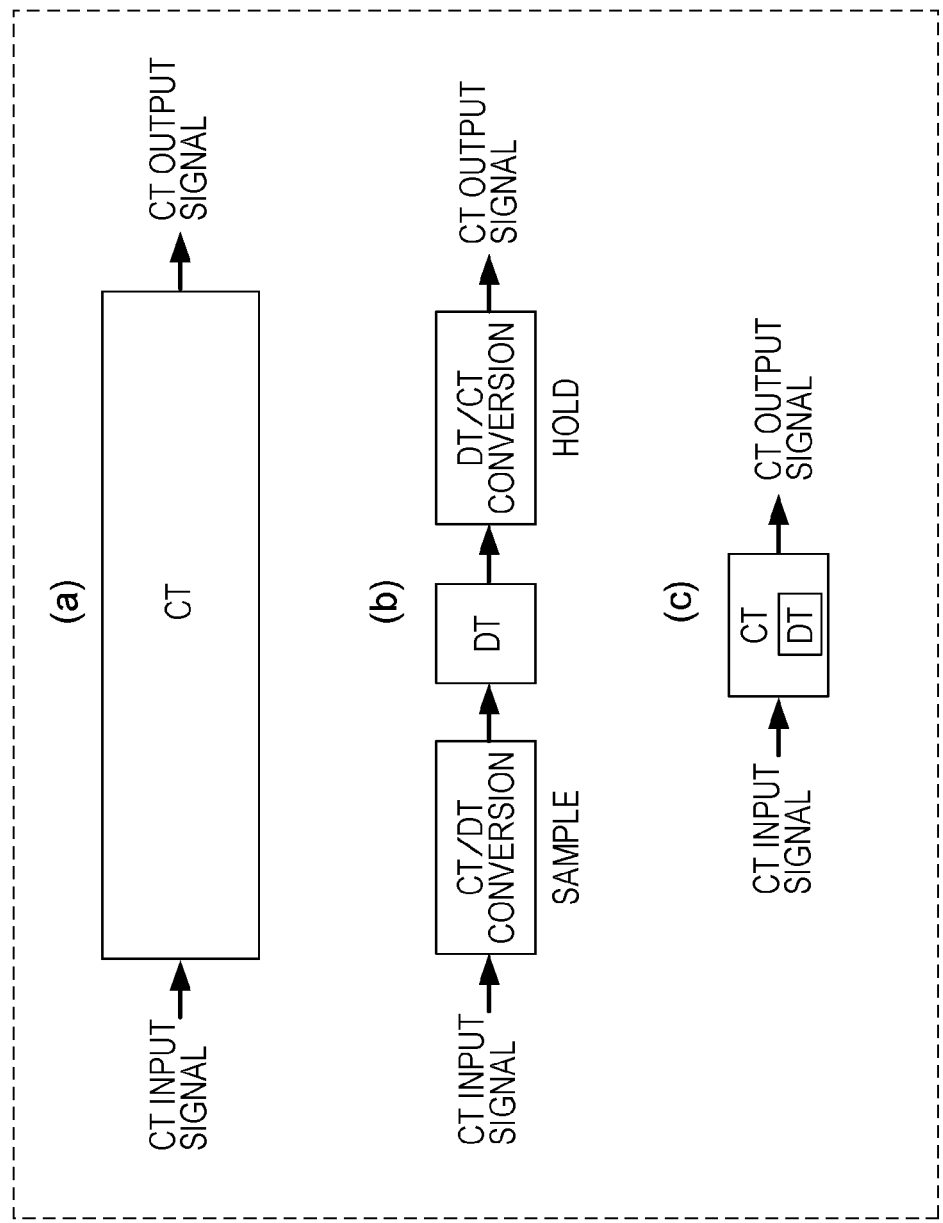

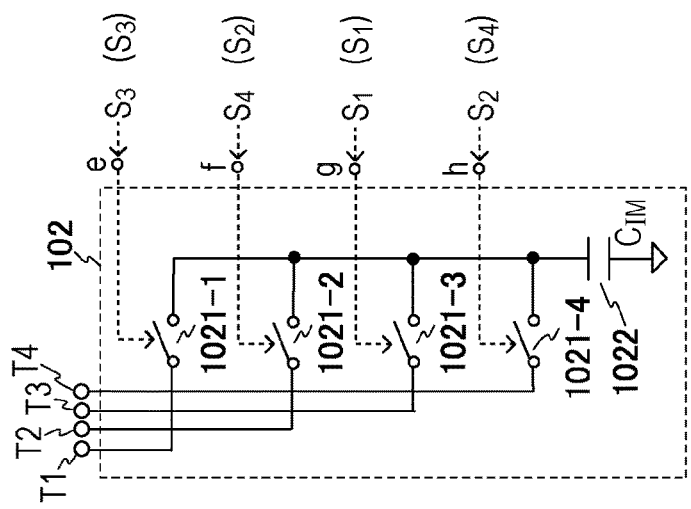
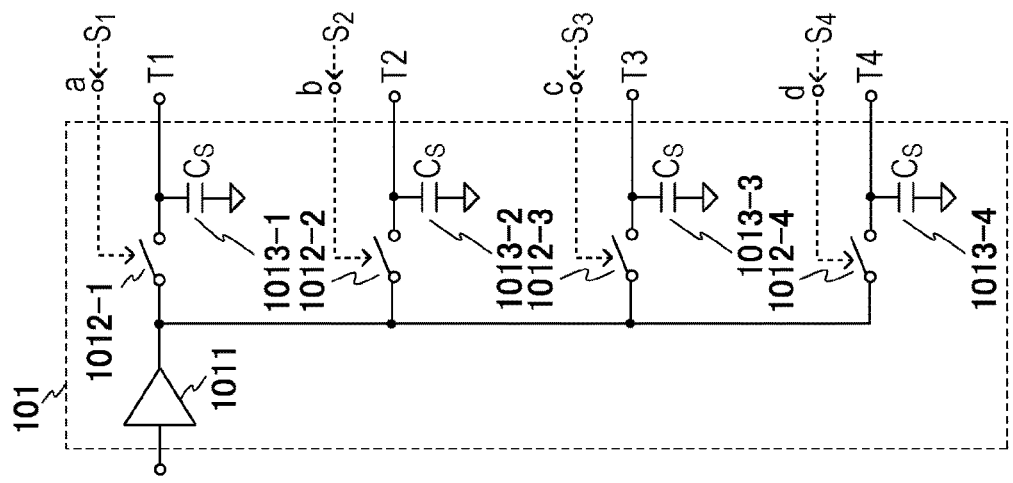
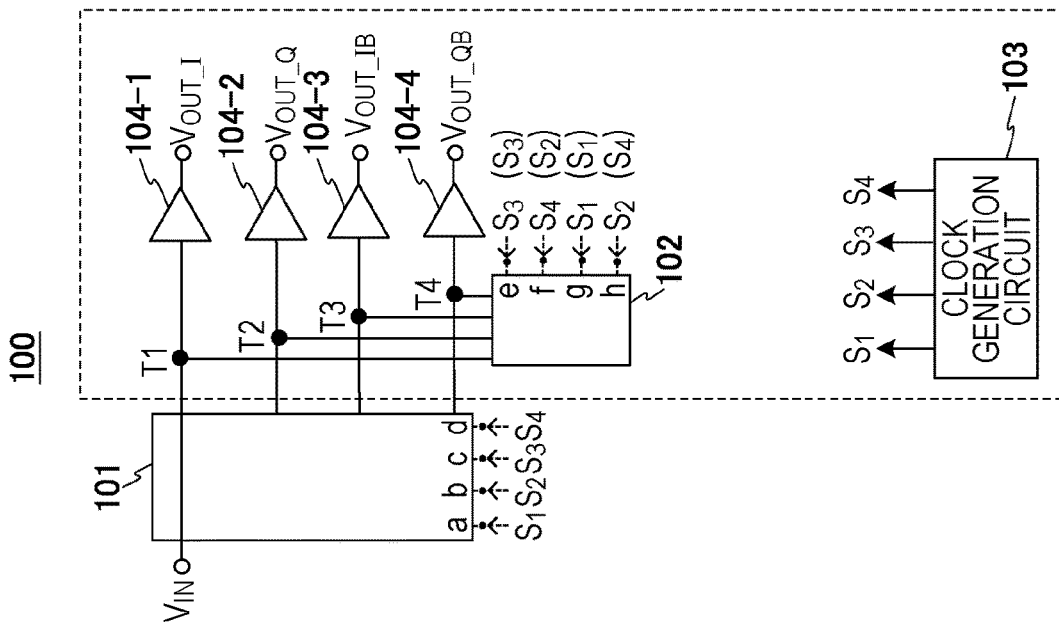

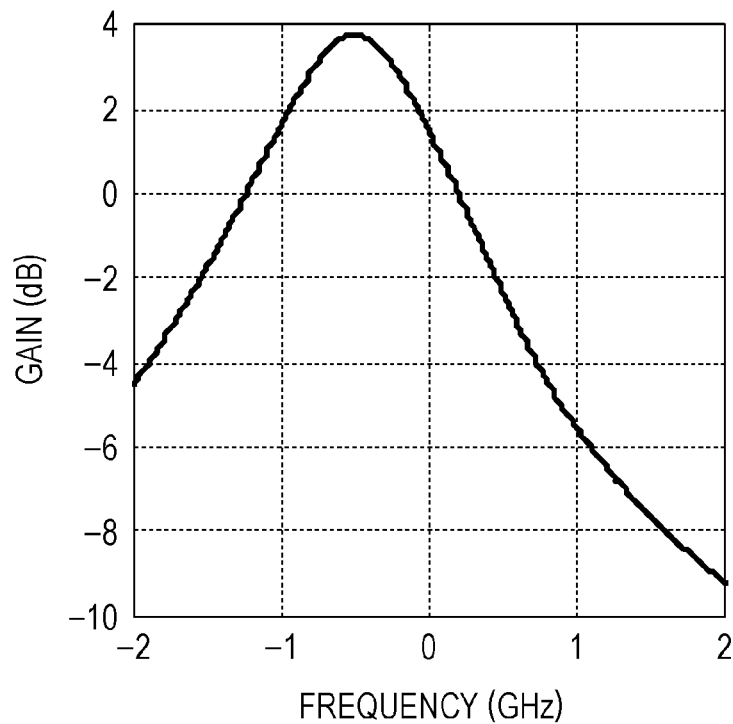

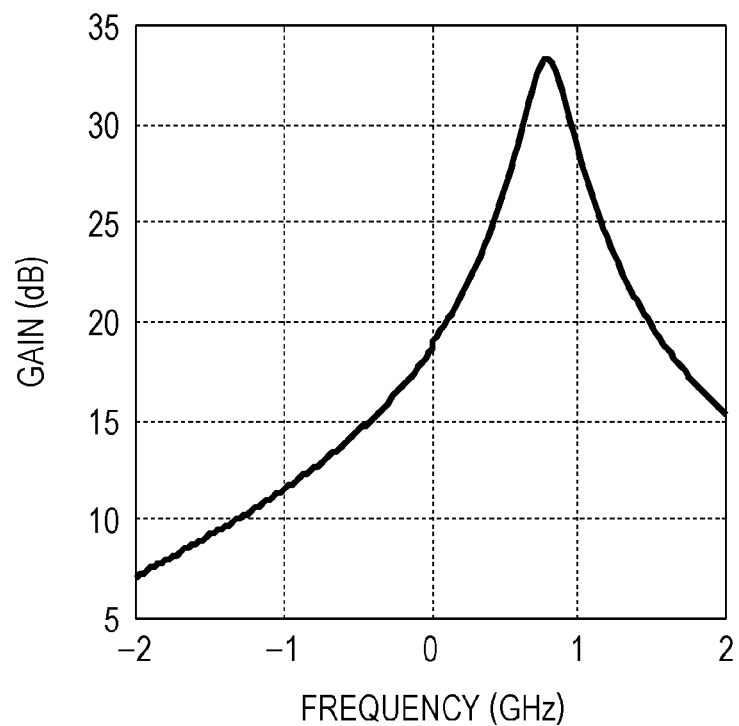

EQUALIZER CIRCUIT AND RECEIVING APPARATUS USING THE SAME

BACKGROUND

1. Technical Field

The present disclosure relates to an equalizer circuit and a wireless apparatus such as a receiving apparatus or the like using the equalizer circuit, and more particularly, for example, to signal processing including an equalizing process and a filtering process or a frequency conversion, based on periodically time varying processing.

2. Description of the Related Art

In designing circuits based on a fine CMOS (Complementary Metal Oxide Semiconductor) process technology, a discrete time analog circuit configuration is known to achieve a high versatility.

For example, U.S. Patent Application Publication No. 2005/0233725 discloses a discrete time analog circuit that performs a frequency conversion and complex filtering on an input analog signal.

In the discrete time analog circuit disclosed in U.S. Patent Application Publication No. 2005/0233725, the frequency conversion and complex filtering based on the discrete time analog signal processing are performed on the input analog signal. More specifically, in the discrete time analog circuit disclosed in U.S. Patent Application Publication No. 2005/0233725, an input voltage is converted to a current by a voltage-to-current conversion circuit, and the resultant current is sampled thereby generating an input charge. Furthermore, in the discrete time analog circuit disclosed in U.S. Patent Application Publication No. 2005/0233725, input charges are transferred among a plurality of capacitors included in this circuit thereby achieving an IIR (Infinite Impulse Response) filter characteristic in which a denominator is given by a linear expression including a complex coefficient.

FIG. 1A is a diagram illustrating an example of a frequency characteristic of an RF (Radio Frequency) amplifier in a broadband wireless system. As shown in FIG. 1A, the frequency characteristic of the RF amplifier in the broadband wireless system is not flat in each channel (CH1 to CH4 in the example shown in FIG. 1A) but a deviation (in-band deviation) exists in a band. Therefore, in the broadband wireless system, it is difficult to achieve a flat frequency characteristic in each channel used, and thus it is necessary to perform a correction of the frequency characteristic (that is, equalization is necessary) in a baseband.

FIG. 1B is a diagram illustrating an example of a frequency characteristic of a transmission path in a broadband wireless system. In wireless communication, as shown in FIG. 1B, the frequency characteristic of the transmission path is not flat, but there is an in-band deviation, and thus it is necessary to make a correction of the frequency characteristic in the baseband.

In a broadband wireless system using a millimeter wave as RF, to realize a broadband transmission characteristic over a large bandwidth greater than a few GHz, a switch has a large influence in terms of a load on a clock and parasitic capacitance. Therefore, the discrete time analog circuit needs to have a simple configuration to reduce the parasitic capacitance and the load on the clock.

However, in conventional discrete time analog circuits such as that disclosed in U.S. Patent Application Publication No. 2005/0233725, it is possible to realize only simple filter characteristics such as a shift of a center frequency. Therefore, in a case where there is an in-band deviation in a frequency characteristic of a transmission path or an RF circuit as with the broadband wireless system, it is difficult for a conventional discrete time analog circuit to function as an equalizer for correcting the in-band deviation. Furthermore, the conventional discrete time analog circuit includes many capacitors and many switches for performing sampling and holding and thus the conventional discrete time analog circuit is complicated in configuration.

SUMMARY

One non-limiting and exemplary embodiment provides an equalizer circuit being simple in configuration and capable of being flexibly adjusted in terms of in-band frequency characteristic and a receiving apparatus using such an equalizer circuit.

In one general aspect, the techniques disclosed here feature an equalizer circuit including one or more phase-to-phase connection circuitry each including an phase-to-phase capacitor and first, second, third, and fourth phase-to-phase switches, one terminal of each of the first, second, third, and fourth phase-to-phase switches being connected to a corresponding one of first, second, third, and fourth connection paths to which first, second, third, and fourth converted signals are respectively input, the first, second, third, and fourth converted signals being generated by converting an input signal, the first, second, third, and fourth converted signals being different in phase by 90° from one converted signal to a next converted signal, the phase-to-phase capacitor being connected to the other one terminal of each of the first, second, third, and fourth phase-to-phase switches; control signal generation circuitry that generates, by converting a reference signal with a particular frequency, 4-phase control signals being different in phase by 90° from one control signal to a next control signal for controlling turning-on/off of the first, second, third, and fourth phase-to-phase switches and outputs the 4-phase control signals respectively to the first, second, third, and fourth phase-to-phase switches; and first, second, third, and fourth output buffers that are respectively connected to the first, second, third, and fourth connection paths and that respectively output 4-phase output signals, wherein a closing of the first, second, third, and fourth phase-to-phase switches are started from any one of phase-to-phase switches in a first order based on the 4-phase control signals, and the first order is a first ascending circulation of the first, the second, the third, and the fourth phase-to-phase switch or a first descending circulation of the fourth, the third, the second, and the first phase-to-phase switch.

According to the present disclosure, it is possible to provide an equalizer circuit formed in a simple configuration and being flexibly adjustable in terms of a frequency characteristic in a band, and a reception apparatus using such an equalizer circuit.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3 is a diagram illustrating differences among a continuous time system, a discrete time system, and a periodically time varying system;

FIG. 4A is a circuit diagram illustrating an example of a circuit configuration of an equalizer circuit according to a first embodiment;

FIG. 4B is a circuit diagram illustrating an example of a circuit configuration of an IQ mixer according to the first embodiment;

FIG. 4C is a circuit diagram illustrating an example of a circuit configuration of an phase-to-phase connection circuit according to the first embodiment;

FIG. 18 is a graph illustrating a result of a circuit simulation in terms of a frequency characteristic of the equalizer circuit according to the seventh embodiment;

FIG. 20 is a graph illustrating a result of a circuit simulation in terms of a frequency characteristic of the equalizer circuit according to the eighth embodiment.

DETAILED DESCRIPTION

Embodiments of the present disclosure are described in detail below with reference to drawings. Note that the embodiments described below are merely examples, and the present disclosure is not limited to these embodiments.

First Embodiment

Configuration of Receiving Apparatus

Figure 2:
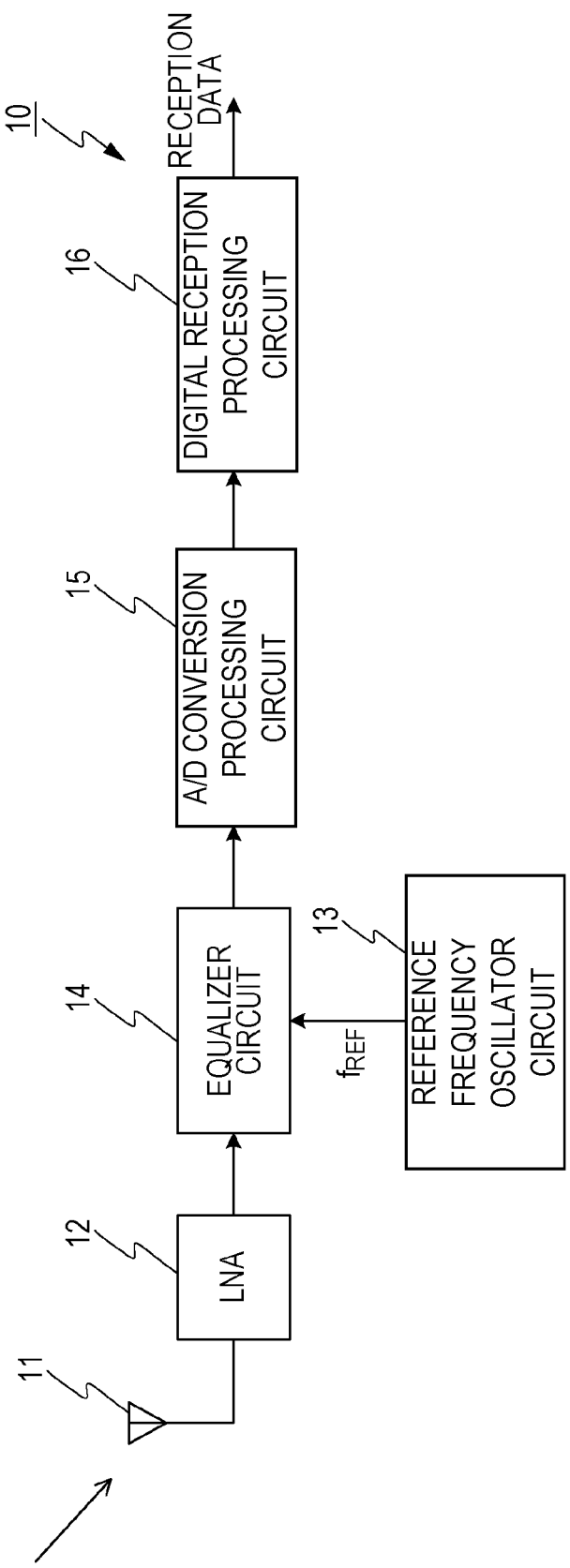
FIG. 2 is a block diagram illustrating a receiving apparatus according to one of first to fifth embodiments of the present disclosure.

FIG. 2 is a diagram illustrating a configuration of a receiving apparatus 10 according to a first embodiment of the present disclosure.

The receiving apparatus 10 shown in FIG. 2 includes an antenna 11, a low noise amplifier (LNA) 12, a reference frequency oscillator circuit 13, an equalizer circuit 14, an analog-to-digital (A/D) conversion processing circuit 15, and a digital reception processing circuit 16.

The antenna 11 receives an RF analog reception signal from a transmission station (not shown) and outputs the received RF analog reception signal to the low-noise amplifier 12.

The low-noise amplifier 12 amplifies the RF analog reception signal and outputs the resultant amplified RF analog reception signal to the equalizer circuit 14.

The reference frequency oscillator circuit 13 generates a reference frequency signal $f_{REF}$ for use in the periodically time varying processing and outputs the resultant reference frequency signal $f_{REF}$ to the equalizer circuit 14.

The equalizer circuit 14 performs frequency conversion and equalizing (filtering) on the RF analog reception signal using the periodically time varying processing based on the reference frequency signal $f_{REF}$. The equalizer circuit 14 outputs a baseband analog reception signal obtained as a result of the equalizing (filtering) to the A/D conversion processing circuit 15. The configuration and the operation of the equalizer circuit 14 will be described later.

The A/D conversion processing circuit 15 converts the baseband analog reception signal to a baseband digital reception signal and outputs the resultant baseband digital signal to the digital reception processing circuit 16.

The digital reception processing circuit 16 performs particular digital reception processing (such as a demodulation process, a decoding process, or the like) on the baseband digital signal thereby generating reception data and outputs the generated reception data.

In the receiving apparatus 10 shown in FIG. 2, it is assumed by way of example that the equalizer circuit 14 outputs the baseband analog reception signal directly from the RF analog reception signal, that is, the equalizer circuit 14 performs direct conversion. However, in the receiving apparatus 10 according to the present embodiment, one or more mixers may be provided, for example, at a stage following the low noise amplifier 12, and an intermediate frequency (IF) may be used.

In the present embodiment, the equalizer circuit 14 is a circuit of a periodically time varying system configured to perform the periodically time varying processing. The circuit of the periodically time varying system is described below in comparison with a circuit of a continuous time system and a circuit of a discrete time system.

FIG. 3 is a diagram illustrating differences among the continuous time systems, the discrete time system, and the periodically time varying system. That is, FIG. 3 conceptually illustrates signal processing performed in respective circuits of the continuous time system, the discrete time system, and the periodically time varying system. In each of the circuits of the continuous time system, the discrete time system, and the periodically time varying system shown in FIG. 3, signal processing is performed on an input continuous time (CT) signal and a resultant continuous time signal is output.

In the circuit of the continuous time system (continuous time circuit) shown in FIG. 3, continuous time signal processing is performed on the input continuous time signal, and a resultant continuous time signal is output. In the case of a passive-type continuous time circuit, it includes elements that are large in size and low in flexibility such as an inductor. Therefore, the passive-type continuous time circuit is not suitable for implementation using the fine CMOS technology, and it is difficult to achieve high versatility in implementation. On the other hand, in the active-type continuous time circuit, it is difficult to design a circuit that can operate with a low power supply voltage, and thus the active-type continuous time circuit is not suitable for implementation using the fine CMOS process technology, and it is difficult to actually achieve the implementation. Even if an active-type continuous time circuit is actually produced, it consumes high power.

The circuit of the discrete time system (discrete time circuit) shown in FIG. 3 samples the input continuous time (CT) signal and converts it to a discrete time (DT) signal by the CT/DT conversion. Furthermore, the discrete time circuit performs discrete time signal processing and holds the resultant discrete time signal and converts it to a continuous time signal by the DT/CT conversion. The discrete time circuit outputs the resultant converted continuous time signal. The discrete time circuit can be configured only using switches, capacitors, and a clock. The characteristic of the discrete time circuit is determined by capacitance ratios of capacitors and the clock frequency, and thus the discrete time circuit is suitable for implementation using the fine CMOS process technology, and has a high implementation versatility can be achieved. However, the discrete time circuit performs the sample-and-hold operation in converting the continuous time signal to the discrete time signal (CT/DT conversion), and thus the discrete time circuit needs a large number of switches to realize processing of a complete discrete time system.

The circuit of the periodically time varying system (periodically time varying circuit) shown in FIG. 3 is a hybrid circuit in which a continuous time circuit including as a part thereof a discrete time circuit is used. In the periodically time varying circuit, it is not necessary to perform a conversion between a continuous time signal and a discrete time signal, and thus it is possible to achieve a design that provides advantages of the discrete time system using a small number of switches. The periodically time varying circuit is suitable for implementation using a fine CMOS process technology, and it is possible to realize a circuit in a simple form having a high implementation versatility.

Configuration of Equalizer Circuit 100

Next, a configuration of the equalizer circuit 100 according to the present embodiment is described below with reference to FIG. 4A to FIG. 4C.

FIG. 4A is a diagram illustrating an example of a configuration of the equalizer circuit 100 according to the first embodiment. The equalizer circuit 100 shown in FIG. 4A corresponds to the equalizer circuit 14 included in the receiving apparatus 10 shown in FIG. 2 and is configured to perform a frequency conversion process and a filtering process.

The equalizer circuit 100 shown in FIG. 4A includes an IQ mixer (conversion circuit) 101, an phase-to-phase connection circuit 102, a clock generation circuit (control signal generation circuit) 103, and output buffers 104 (104-1 to 104-4).

FIG. 4B is a diagram illustrating an example of a configuration of the IQ mixer 101 according to the first embodiment. The IQ mixer 101 includes a transconductance amplifier (TA) 1011 functioning as a voltage-to-current conversion circuit, switches 1012 (1012-1 to 1012-4), and sample capacitors 1013 (1013-1 to 1013-4).

The TA 1011 converts an input analog signal given as input voltage signal $V_{IN}$ to a current ($g_m \times V_{IN}$). Note that $g_m$ denotes a value of a transconductance of the TA 1011.

One terminal of each of the switches 1012-1 to 1012-4 is connected to an output terminal of the TA 1011, and the other terminal is connected to an input terminal of a corresponding one of the output buffers 104-1 to 104-4. The switches 1012-1 to 1012-4 are turned on/off under the control of control signals input via respective terminals a to d. In the case shown in FIG. 4B, the switch 1012-1 is in an ON-state during a period in which a control signal $S_1$ input via the terminal a is at a high level. Similarly, the switch 1012-2 is in the ON-state during a period in which a control signal $S_2$ input via the terminal b is at the high level. The switch 1012-3 is in the ON-state during a period in which a control signal $S_3$ input via the terminal c is at the high level. The switch 1012-4 is in the ON-state during a period in which a control signal $S_4$ input via the terminal d is at the high level.

One end of each of the sample capacitors 1013-1 to 1013-4 is grounded, and the other end is connected to a corresponding one of the terminals T1 to T4. The sample capacitors 1013-1 to 1013-4 accumulate input charges during periods in which the respective switches 1012-1 to 1012-4 are in the ON state. Further details of the operation of the equalizer circuit 100 will be described later.

In the configuration shown in FIG. 4B, the IQ mixer 101 converts the input signal into 4-phase signals (first to fourth converted signals) being different in phase by 90° from one signal to a next signal where the 4-phase signals include an in-phase component signal (hereinafter referred to as an I-phase signal), a quadrature component signal (hereinafter referred to as a Q-phase signal), a signal with a phase opposite to that of the I-phase signal (hereinafter referred to as an IB-phase signal), and a signal with a phase opposite to that of the Q-phase signal (hereinafter referred to as a QB-phase signal), and the IQ mixer 101 outputs the respective resultant 4-phase signals to different paths. Hereinafter, the path via which the I-phase signal (the first converted signal) is output from the IQ mixer 101, the path via which the Q-phase signal (the second converted signal) is output, the path via which the IB-phase signal (the third converted signal) is output, and the path via which the QB-phase signal (the fourth converted signal) is output are respectively referred to as an I-phase path (a first connection path), a Q-phase path (a second connection path), an IB-phase path (third connection path), and a QB-phase path (fourth connection path). The input signal (input data) may include at least one of video, picture, audio, text, and control signal.

FIG. 4C is a diagram illustrating an example of a configuration of the phase-to-phase connection circuit 102 according to the first embodiment. The phase-to-phase connection circuit 102 includes switches (phase-to-phase switches) 1021 (1021-1 to 1021-4) and an phase-to-phase capacitor (phase-to-phase capacitance) 1022.

One terminal of each of the switches 1021-1 to 1021-4 is connected to a corresponding one of terminals including a terminal T1 on an I-phase path, a terminal T2 on a Q-phase path, a terminal T3 on an IB-phase path, and a terminal T4 on a QB-phase path, while the other terminal of each switch is connected to the phase-to-phase capacitor 1022. The switches 1021-1 to 1021-4 are turned on/off under the control of respective control signals input via terminals e to h. In the case shown in FIG. 4C, the switch 1021-1 is in the ON-state during a period in which a control signal $S_3$ input via a terminal e is at the high level. Similarly, the switch 1021-2 is in the ON-state during a period in which a control signal $S_4$ input via a terminal f is at the high level. The switch 1021-3 is in the ON-state during a period in which a control signal $S_1$ input via a terminal g is at the high level. The switch 1021-4 is in the ON-state during a period in which a control signal $S_2$ input via a terminal h is at the high level.

One terminal of the phase-to-phase capacitor 1022 is connected in common to the terminals of the switches 1021-1 to 1021-4, and the other terminals of the phase-to-phase capacitor 1022 is grounded.

The phase-to-phase capacitor 1022 is connected to the I-phase path during a period in which the switch 1021-1 is in the ON-state. In this state, the phase-to-phase capacitor 1022 performs charge sharing with the sample capacitor 1013-1. Similarly, the phase-to-phase capacitor 1022 is connected to the Q-phase path during a period in which the switch 1021-2 is in the ON-state. In this state, the phase-to-phase capacitor 1022 performs charge sharing with the sample capacitor 1013-2. The phase-to-phase capacitor 1022 is connected to the IB-phase path during a period in which the switch 1021-3 is in the ON-state. In this state, the phase-to-phase capacitor 1022 performs charge sharing with the sample capacitor 1013-3. The phase-to-phase capacitor 1022 is connected to the QB-phase path during a period in which the switch 1021-4 is in the ON-state. In this state, the phase-to-phase capacitor 1022 performs charge sharing with the sample capacitor 1013-4.

With the configuration described above, the phase-to-phase capacitor 1022 performs charge accumulation and charge sharing among different paths in the above-described manner. Further details of the operation of the equalizer circuit 100 will be described later.

The clock generation circuit (the control signal generation circuit) 103 generates a control signal based on the reference frequency signal ($f_{REF}$) output from the reference frequency oscillator circuit 13 (see FIG. 2), and supplies the resultant control signal to the IQ mixer 101 and the phase-to-phase connection circuit 102.

The output buffers 104-1 to 104-4, in the respective four phases of the I-phase, the Q-phase, the IB-phase, and the QB-phase, receive continuous voltage changes resulting from accumulation of input charges and instantaneous voltage changes resulting from the charge sharing between the sample capacitor 1013 and the phase-to-phase capacitor 1022, and these voltage changes are output directly or after being multiplied with a constant factor thereby outputting output voltage signals $V_{OUT}$ ($V_{OUT\_I}$, $V_{OUT\_Q}$, $V_{OUT\_IB}$, and $V_{OUT\_QB}$) of the respective phases.

Control Signals Generated by Clock Generation Circuit 103

Figure 5:
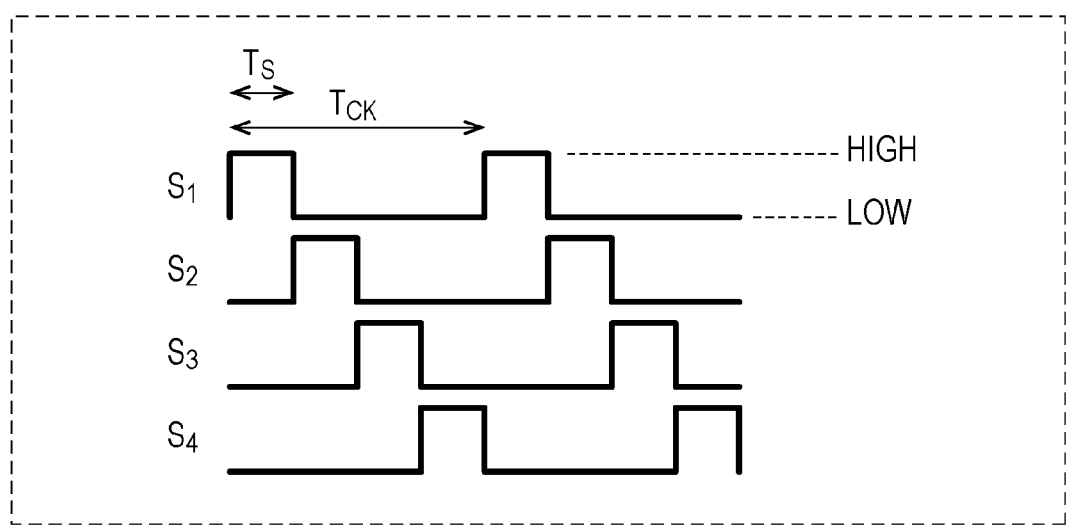
FIG. 5 is a timing chart illustrating an example of a set of control signals.

The control signals generated by the clock generation circuit 103 are described below. FIG. 5 is a timing chart associated with the control signals. The control signals $S_1$ to $S_4$ each have a pulse width Ts and a period $T_{CK}$. Although in FIG. 5, each control signal has a rectangular shape, the equalizer circuit 100 is capable of operating with even clock signals with unsharp rising/falling edges.

As shown in FIG. 5, the clock generation circuit 103 provides, to the equalizer circuit 100, 4-phase control signals $S_1$ to $S_4$ each having a duty ratio (=pulse width Ts/period $T_{CK}$ of the control signal) of 0.25 and being different in phase by 90° from one control signal to a next control signal.

In the case of the direct conversion, the clock frequency $f_{CK}$ ($f_{CK}=1/T_{CK}$) of the control signals is determined by the frequency of a signal input to the equalizer circuit. For example, in a case where the frequency of the input signal is 60 GHz, the clock frequency $f_{CK}$ is 60 GHz.

Operation of Equalizer Circuit 100

Next, the operation of the equalizer circuit 100 is described below.

The equalizer circuit 100 performs the charge sharing and the charge accumulation periodically with the periods $T_{CK}$. The equalizer circuit 100 performs the charge sharing for the following three types of charges:

(1-a) Charge associated with a current to which the input voltage signal $V_{IN}$ is converted by the TA 1011;
(1-b) Charge stored in the phase-to-phase capacitor 1022; and
(1-c) Charge stored in the sample capacitor 1013.

The equalizer circuit 100 performs four operations described below in one period ($1T_{CK}$) by turning on-off the switches 1012-1 to 1012-4 and the switches 1021-1 to 1021-4 under the control of the control signals $S_1$ to $S_4$ shown in FIG. 5, and the equalizer circuit 100 repeats these operations every period $T_{CK}$.

First operation: During a period in which the control signal $S_1$ is at the high level, the sample capacitor 1013-1 is connected to the TA 1011 and thus the input charge is accumulated in the sample capacitor 1013-1. At a point of time immediately before the charge accumulation described above starts, a charge obtained one period before remains in the sample capacitor 1013-1. At the same time as the input charge is accumulated in the sample capacitor 1013-1, the phase-to-phase capacitor 1022 is connected to the sample capacitor 1013-3 and charge sharing is performed.

Second operation: During a period in which the control signal $S_2$ is at the high level, the sample capacitor 1013-2 is connected to the TA 1011 and thus the input charge is accumulated in the sample capacitor 1013-2. At a time immediately before the charge accumulation described above starts, a charge obtained one period before remains in the sample capacitor 1013-2. At the same time as the input charge is accumulated in the sample capacitor 1013-2, the phase-to-phase capacitor 1022 is connected to the sample capacitor 1013-4 and charge sharing is performed.

Third operation: During a period in which the control signal $S_3$ is at the high level, the sample capacitor 1013-3 is connected to the TA 1011 and thus the input charge is accumulated in the sample capacitor 1013-3. At a time immediately before the charge accumulation described above starts, a charge obtained one period before remains in the sample capacitor 1013-3. At the same time as the input charge is accumulated in the sample capacitor 1013-3, the phase-to-phase capacitor 1022 is connected to the sample capacitor 1013-1 and charge sharing is performed.

Fourth operation: During a period in which the control signal $S_4$ is at the high level, the sample capacitor 1013-4 is connected to the TA 1011 and thus the input charge is accumulated in the sample capacitor 1013-4. At a time immediately before the charge accumulation described above starts, a charge obtained one period before remains in the sample capacitor 1013-4. At the same time as the input charge is accumulated in the sample capacitor 1013-4, the phase-to-phase capacitor 1022 is connected to the sample capacitor 1013-2 and charge sharing is performed.

The equalizer circuit 100 performs the sequence of the first operation, the second operation, the third operation, and the fourth operation repeatedly every period of $T_{CK}$. By repeating the first to fourth operations sequentially, the input charge is accumulated sequentially in the sample capacitors 1013-1, 1013-2, 1013-3, and 1013-4. In the process, the phase-to-phase capacitor 1022 is connected sequentially to the IB-phase path, the QB-phase path, the I-phase path, and the Q-phase path. In this process, the phase-to-phase capacitor 1022 performs the charge sharing sequentially with the sample capacitors 1013-3, 1013-4, 1013-1, and 1013-2.

That is, in this case, the first switch (the first phase-to-phase switch) 1021-1, the second switch (the second phase-to-phase switch) 1021-2, the third switch (the third phase-to-phase switch) 1021-3, and the fourth switch (the fourth phase-to-phase switch) 1021-4 are turned on sequentially in an ascending order starting with an N-th switch (where N is an integer in the range of 1 to 4). When the turning-on of the fourth switch 1021-4 is completed, the first switch 1021-1 connected to one of the 4-phase connection paths is turned on. As the switches 1021 connected to the respective 4-phase connection paths are turned on sequentially and cyclically, the phase-to-phase capacitor 1022 is connected sequentially and cyclically to the 4-phase connection paths in the same order as the phase rotation order of I-phase, Q-phase, IB-phase, QB-phase. In this process, the phase-to-phase capacitor 1022 performs the charge sharing sequentially with the sample capacitors 1013-3, 1013-4, 1013-1, and 1013-2. As a result, charge sharing is performed between the charges stored in the sample capacitors 1013 via the input charge accumulation performed at intervals of $T_{CK}$ and the charges stored in the phase-to-phase capacitor 1022 via the charge sharing performed at intervals of $T_{CK}/4$.

In this process, although the timing of accumulating the input charge in the sample capacitor 1013 and the timing of performing the charge sharing between the sample capacitor 1013 and the phase-to-phase capacitor 1022 are different among the sample capacitors 1013, the order of accumulating the input charge is the same as the order of sharing the charge.

Next, an explanation is given below as to a discrete system, which is a core of the frequency characteristics in the first to fourth operations.

Let $C_{IM}$ and $C_S$ respectively denote capacitance values of the phase-to-phase capacitor 1022 and the sample capacitor 1013, let $q_{in}(n)$ denote an n-th input charge (where n is an integer), and let $v_{OUT}(n)$ and $v_{OUT}(n-1)$ respectively denote n-th and (n-1)th output voltages, then the charge sharing in the n-th charge sharing (where n is an integer) in the equalizer circuit 100 can be approximately described by a difference equation (1).

$$q_{in}(n)+jC_{IM}v_{out}(n)+C_S v_{out}(n-1)=(C_S+C_{IM})v_{out}(n) \quad (1)$$

In equation (1), the first term on the left side represents the input charge, and the second term on the left side represents the charge stored in the phase-to-phase capacitor 1022, that is, the charge stored as a result of the charge sharing performed ¼ period before. The imaginary unit j included in this second term occurs because the phase-to-phase capacitor 1022 performs the charge sharing with a phase shift of ¼ period. The third term on the left side represents the charge of an immediate previous period stored in the sample capacitor 1011. When the n-th input charge is represented as $Q_{IN}(n)=(C_S+C_{IM})AV_{IN}(n)$ where A is a coefficient determined by the input charge accumulation, applying z-transformation yields a transfer function $H_D$ as described below in equation (2), which is an approximate representation of the core of the discrete system of the equalizer circuit 100.

$$H_D = \frac{A}{\frac{C_{IM}}{C_S+C_{IM}}(1-j)+\frac{C_S}{C_S+C_{IM}}(1-z^{-1})} \quad (2)$$

$$z = e^{j\omega_{in}T_{CK}}$$

where $\omega_{in}$ is the angular frequency of the input voltage signal. By representing the transfer function $H_D$ so as to include the imaginary unit j, it becomes possible to achieve a frequency characteristic asymmetric about a center frequency.

Figure 6A:
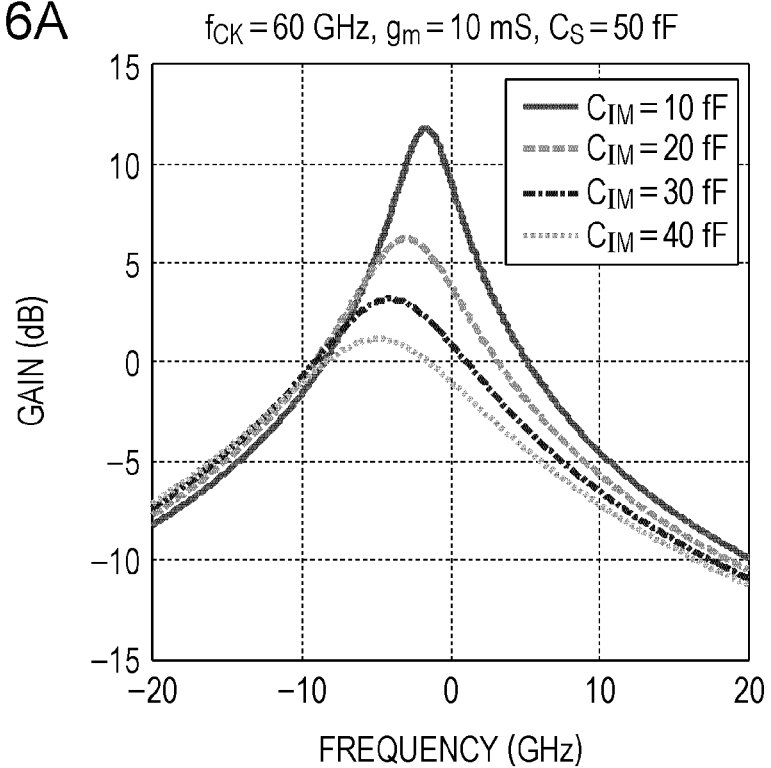
FIG. 6A is a graph illustrating a result of a circuit simulation in terms of a frequency characteristic of the equalizer circuit according to the first embodiment.

The frequency characteristic of the equalizer circuit 100 is explained below. FIG. 6A illustrates a result of circuit simulation of the frequency characteristic for the equalizer circuit 100 according to the first embodiment. In FIG. 6A, a horizontal axis represents an output frequency, and a vertical axis represents a gain. Note that the output frequency is given by the input frequency—$f_{CK}$. The frequency characteristic of the equalizer circuit 101 shown in FIG. 6A is obtained as a result of simulation performed for values of $C_S$=50 fF, $f_{CK}$=60 GHz, and gm=10 mS and for various values of $C_{IM}$ in the range of 10 fF to 40 fF. Note that in the equalizer 100, $C_{IM}$ may be fixed, and $C_S$ may be varied.

As shown in FIG. 6A, the equalizer circuit 100 can have a frequency characteristic in which the gain peak position is shifted to a lower frequency from the center frequency when the control signals $S_3$, $S_4$, $S_1$, and $S_2$ are respectively input to the terminals e to h of the phase-to-phase connection circuit 102.

Note that in the equalizer circuit 100 according to the present embodiment, when the control signals $S_3$, $S_2$, $S_1$, and $S_4$ are respectively input to the terminals e to h of the phase-to-phase connection circuit 102 as with the case in which the controls signals denoted in parentheses in FIG. 4A or FIG. 4C, a different frequency characteristic is obtained.

In the case where the control signals $S_3$, $S_2$, $S_1$, and $S_4$ are respectively input to the terminals e to h of the phase-to-phase connection circuit 102, the first switch (the first phase-to-phase switch) 1021-1, the second switch (the second phase-to-phase switch) 1021-2, the third switch (the third phase-to-phase switch) 1021-3, and the fourth switch (the fourth phase-to-phase switch) 1021-4 are turned on sequentially in the descending order starting from an M-th switch (where M is an integer in the range from 1 to 4). After the turning-on of the first switch 1021-1 is completed, the fourth switch 1021-4 connected to one of the 4-phase connection paths is turned on. As the switches 1021 connected to the respective 4-phase connection paths are turned on sequentially and cyclically, the phase-to-phase capacitor 1022 is sequentially and cyclically connected to the IB-phase path, the Q-phase path, the I-phase path, and the QB-phase path. That is, the phase-to-phase capacitor 1022 is connected to the 4-phase connection paths in the order opposite to phase rotation order I-phase, Q-phase, IB-phase, QB-phase.

In this case, the order of performing the charge sharing between the phase-to-phase capacitor 1022 and the sample capacitors 1013 is opposite to the order of performing the accumulation of the input charge in the sample capacitors 1013. More specifically, the input charge accumulation is performed sequentially in the sample capacitors 1013-1, 1013-2, 1013-3, 1013-4 and repeated cyclically, while the charge sharing is performed when the phase-to-phase capacitor 1022 is sequentially connected to the sample capacitors 1013-3, 1013-2, 1013-1, and 1013-4 and the sequential connection is repeated cyclically.

Because the phase-to-phase capacitor 1022 is connected to the 4-phase connection paths sequentially in the order opposite to the phase rotation order I-phase, Q-phase, IB-phase, QB-phase, charge sharing is performed with a phase shift of ¾ period (that is, −¼ period). This causes an inversion of the sign of a coefficient multiplied by an imaginary unit j in the transfer function $H_D$ of the equalizer circuit 100. The inversion of the sign of the coefficient multiplied by the imaginary unit j in the transfer function $H_D$ makes it possible for the equalizer circuit 100 to have a frequency characteristic in which the gain peak position is shifted toward a high frequency from the center frequency. In the case where the phase-to-phase capacitor 1022 is sequentially connected to the 4-phase connection paths in the normal order in terms of phase rotation, the imaginary term is negative, while in the case where the phase-to-phase capacitor 1022 is sequentially connected to the 4-phase connection paths in the reverse order in terms of phase rotation, the imaginary term is positive.

Figure 6B:
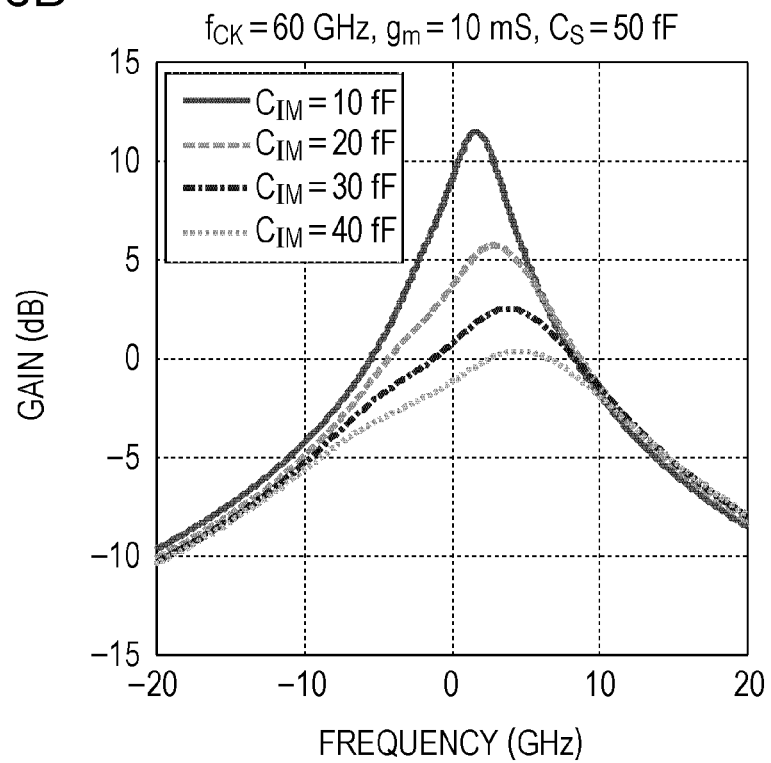
FIG. 6B is a graph illustrating a result of a circuit simulation in terms of a frequency characteristic of the equalizer circuit according to the first embodiment.

FIG. 6B illustrates a frequency characteristic for a case where the control signals $S_3$, $S_2$, $S_1$, and $S_4$ are input to the respective terminals e to h of the phase-to-phase connection circuit 102. In FIG. 6B, horizontal and vertical axes and parameters of respective elements are taken in a similar manner as in FIG. 6A. In the case where the phase-to-phase capacitor 1022 is sequentially connected to the 4-phase connection paths in the order opposite to the phase rotation order I-phase, Q-phase, IB-phase, QB-phase, it is possible to realize the equalizer circuit 100 having a frequency characteristic in which the gain peak position is shifted toward a higher frequency from the center frequency as shown in FIG. 6B.

Effects

Figure 1B:
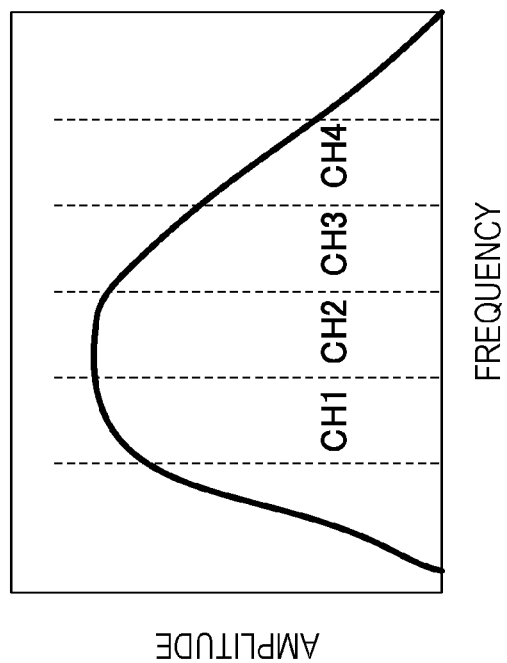
FIG. 1B is a graph illustrating an example of a frequency characteristic of an in a transmission path in a broadband system.
Figure 1A:
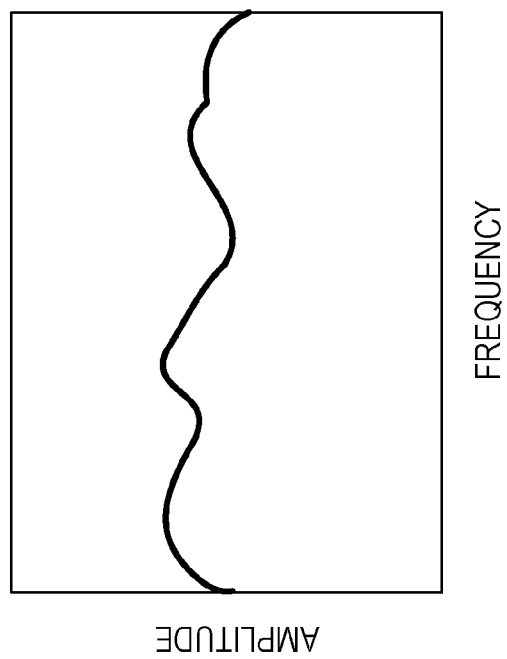
FIG. 1A is a graph illustrating an example of a frequency characteristic of an RF amplifier in a broadband system.

According to the present embodiment, as described above, the phase-to-phase capacitor 1022 is sequentially connected to the 4-phase connection paths and the charge sharing is performed with a phase shift of ¼ period (or −¼ period), and thus it is possible to realize a transfer function $H_D$ including an imaginary term. The realization of the transfer function $H_D$ including an imaginary term allows the equalizer circuit 100 according to the present embodiment to have a frequency characteristic asymmetric about the center frequency as shown in FIG. 6A and FIG. 6B. Thus, the equalizer circuit according to the present embodiment allows it to realize a filter which is adjustable in terms of an in-band deviation. That is, the equalizer circuit according to the present embodiment is capable of performing an equalization process so as to reduce an in-band deviation occurring in a frequency characteristic of an RF circuit such as that shown in FIG. 1A.

In the present embodiment, conversion from the continuous time signal to the discrete time signal is not performed, and thus it is possible to reduce the number of switches compared with the number of switches used in the conventional discrete time analog circuit. Therefore, in the present embodiment, even in a case where the passband has a large bandwidth such as a few GHz or larger, it is possible to reduce influences of loads on the clock and parasitic capacitance. This means that the equalizer circuit 100 according to the present embodiment is suitable for use in a broadband operation.

In the equalizer circuit 100, the sample capacitor 1013 and the phase-to-phase capacitor 1022 may be configured to be variable, which makes it possible to easily change the characteristic of the equalizer circuit 100. This makes it possible to change the characteristic adaptively in response to a change in a communication environment such as a change in ambient temperature, power supply voltage, or the like or adaptively to reduce the influence of a variation of characteristics of circuit elements.

Variable capacitors may be realized by controlling the number of capacitors connected via switches, by controlling a voltage applied to a varactor thereby changing the capacitance of the varactor, or the like. Such methods may also be applicable in other embodiments described below.

The switches 1012 and 1021 each may be implemented using a transistor. In a case where transistors are produced using fine CMOS process technology, generally usable transistor configurations include an NMOS transistor configuration, a PMOS transistor configuration, a complementary switching configuration using an NMOS transistor and a PMOS transistor.

In the above-described description with reference to FIGS. 4A to 4C, it is assumed by way of example but not limitation that the timing of performing the charge accumulation in the sample capacitor 1013 is different from the timing of performing the charge sharing between the sample capacitor 1013 and the phase-to-phase capacitor 1022. Alternatively, the charge accumulation and the charge sharing may be performed at the same time. In the case where the charge accumulation and the charge sharing are performed at the same time, the terminals e to h are respectively input with the control signals $S_1$, $S_2$, $S_3$, and $S_4$. That is, to achieve a shift toward lower frequencies, the control signals applied to the respective terminals e to h may be $S_1$, $S_2$, $S_3$, and $S_4$, or $S_2$, $S_3$, $S_4$, and $S_1$, or $S_3$, $S_4$, $S_1$, and $S_2$, or $S_4$, $S_1$, $S_2$, and $S_3$.

Depending on the frequency characteristic to be realized, the phase-to-phase capacitor $C_{IM}$ may be connected to a buffer such that a voltage is output from the phase-to-phase capacitor $C_{IM}$.

Second Embodiment

Next, a second embodiment of the present disclosure is described below. In a circuit according to this second embodiment, a plurality of equalizer circuits 100 according to the first embodiment are connected.

Configuration and Operation of Equalizer Circuit 200

Figure 7:
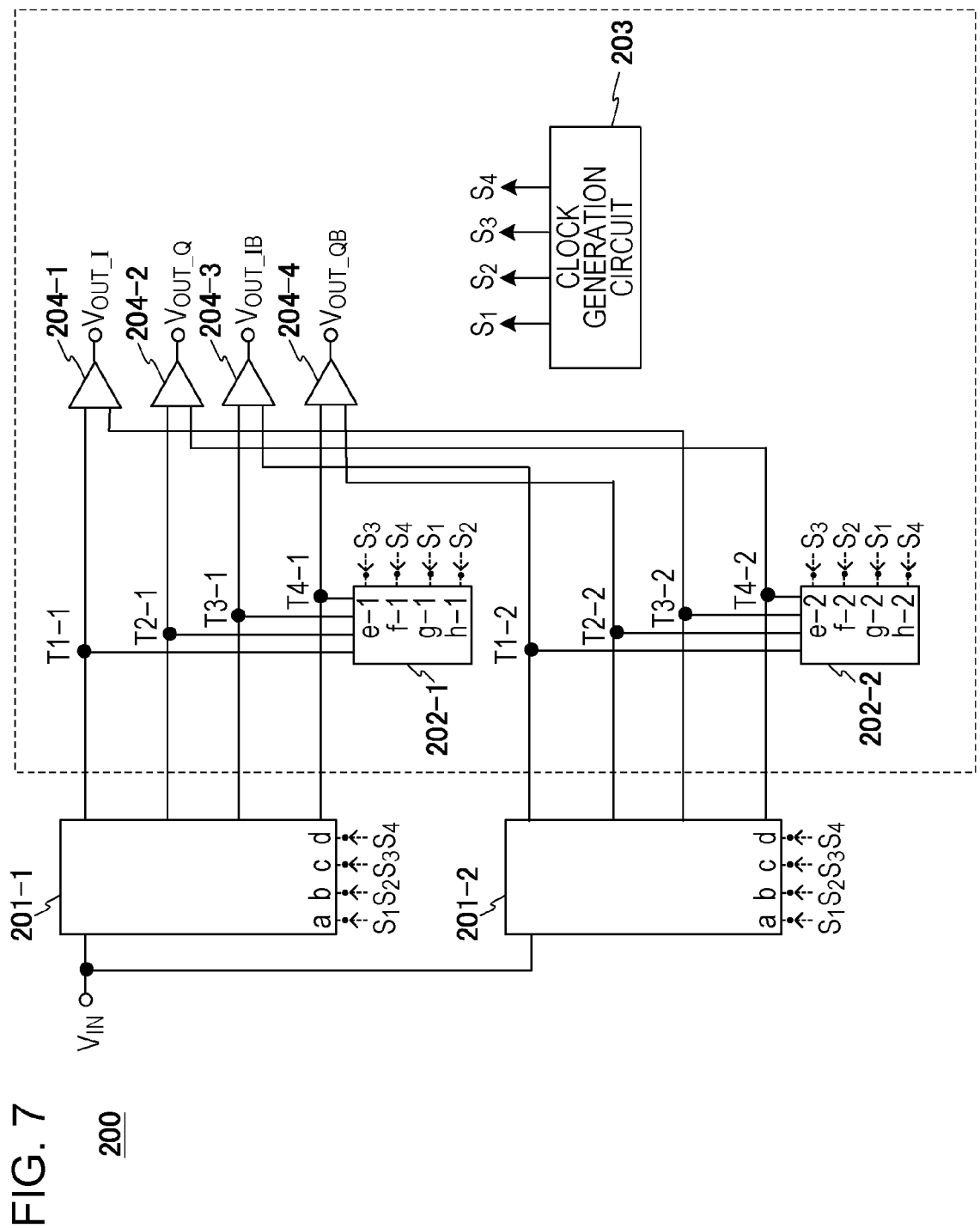
FIG. 7 is a circuit diagram illustrating an example of a circuit configuration of an equalizer circuit according to a second embodiment.

FIG. 7 is a diagram illustrating an example of a configuration of an equalizer circuit 200 according to a second embodiment. The equalizer circuit 200 shown in FIG. 7 includes IQ mixers 201-1 and 201-2, phase-to-phase connection circuits 202-1 and 202-2, a clock generation circuit (control signal generation circuit) 203, and output buffers 204-1 to 204-4. The clock generation circuit 203 is similar to the clock generation circuit 103 shown in FIG. 4A.

The IQ mixers 201-1 and 201-2 are similar in configuration to the IQ mixer 101 shown in FIG. 4B. The phase-to-phase connection circuits 202-1 and 202-2 are similar in configuration to the phase-to-phase connection circuit 102 shown in FIG. 4C. However, control signals input to the phase-to-phase connection circuit 202-1 are different from the control signals input to the phase-to-phase connection circuit 202-2.

More specifically, to the terminals e to h of the phase-to-phase connection circuit 202-1, control signals $S_3$, $S_4$, $S_1$, and $S_2$ are respectively input. In this case, the phase-to-phase capacitor 1022 of the phase-to-phase connection circuit 202-1 is connected sequentially and cyclically to the IB-phase path, the QB-phase path, the I-phase path, and the Q-phase path. During the sequential connection process, the phase-to-phase capacitor 1022 of the phase-to-phase connection circuit 202-1 performs the charge sharing sequentially with the sample capacitors 1013-3, 1013-4, 1013-1, and 1013-2 of the IQ mixer 201-1. That is, the first switch (first phase-to-phase switch) 1021-1, the second switch (second phase-to-phase switch) 1021-2, the third switch (third phase-to-phase switch) 1021-3, and the fourth switch (fourth phase-to-phase switch) 1021-4 are turned on sequentially in an ascending order starting with an N-th switch (where N is an integer in the range of 1 to 4). When the turning-on of the fourth switch 1021-4 is completed, the first switch 1021-1 connected to one of the 4-phase connection paths is turned on. As the switches 1021 connected to the respective 4-phase connection paths are sequentially and cyclically turned on, the phase-to-phase capacitor 1022 of the phase-to-phase connection circuit 202-1 is connected to the 4-phase connection paths sequentially in the same order as the order of the phase rotation I-phase, Q-phase, IB-phase, QB-phase. In the circuit including the IQ mixer 201-1 and the phase-to-phase connection circuit 202-1, the order of performing the input charge accumulation is the same as the order of performing the charge sharing.

On the other hand, to the terminals e to h of the phase-to-phase connection circuit 202-2, control signals $S_3$, $S_2$, $S_1$, and $S_4$ are respectively input. In this case, the phase-to-phase capacitor 1022 of the phase-to-phase connection circuit 202-2 is connected sequentially and cyclically to the 4-phase connection paths in the order the IB-phase path, the Q-phase path, the I-phase path, the QB-phase path. During this sequential connection process, the phase-to-phase capacitor 1022 of the phase-to-phase connection circuit 202-1 performs the charge sharing sequentially with the sample capacitors 1013-3, 1013-2, 1013-1, and 1013-4 of the IQ mixer 201-2. That is, the first switch (first phase-to-phase switch) 1021-1, the second switch (second phase-to-phase switch) 1021-2, the third switch (third phase-to-phase switch) 1021-3, and the fourth switch (fourth phase-to-phase switch) 1021-4 are sequentially turned on in the descending order starting with an M-th switch (where M is an integer in the range from 1 to 4). When the turning-on of the first switch 1021-1 is completed, the fourth switch 1021-4 connected to one of the 4-phase connection paths is turned on. As the switches 1021 connected to the respective 4-phase connection paths are sequentially and cyclically turned on, the phase-to-phase capacitor 1022 of the phase-to-phase connection circuit 202-1 is connected to the 4-phase connection paths sequentially in the order opposite to the phase rotation order I-phase, Q-phase, IB-phase, QB-phase. In the circuit including the IQ mixer 201-2 and the phase-to-phase connection circuit 202-2, the charge sharing is performed in the order opposite to the order of performing the input charge accumulation.

In the equalizer circuit 200, the order of the switching operations of the switches 1021 in the phase-to-phase connection circuit 202-1 for connection between the IQ mixer 201-1 and the phase-to-phase connection circuit 202-1 is different from the order of the switching operations of the switches 1021 in the phase-to-phase connection circuit 202-2 for connection between the IQ mixer 201-2 and the phase-to-phase connection circuit 202-2.

The specific operation of the equalizer circuit 200 is similar to that of the equalizer circuit 100 according to the first embodiment described above, and thus a further description thereof is omitted.

In the circuit including the IQ mixer 201-1 and the phase-to-phase connection circuit 202-1, the phase-to-phase capacitor 1022 is connected to the 4-phase connection paths sequentially in the same order as the order of the phase rotation I-phase, Q-phase, IB-phase, QB-phase, and thus it is possible to realize a frequency characteristic in which the gain peak position is shifted toward a lower frequency from the center frequency as with the first embodiment described above. In the circuit including the IQ mixer 201-2 and the phase-to-phase connection circuit 202-2, the phase-to-phase capacitor 1022 is connected to the 4-phase connection paths sequentially in the order opposite to the order of the phase rotation I-phase, Q-phase, IB-phase, QB-phase, and thus it is possible to realize a frequency characteristic in which the gain peak position is shifted toward a higher frequency from the center frequency as with the first embodiment described above.

In FIG. 7, the output buffers 204-1 to 204-4 are respectively connected to particular paths such that the phase of the signals output from the IQ mixer 201-1 is opposite to the phase of the corresponding signals output from the IQ mixer 201-2. The output buffers 204-1 to 204-4 are each configured to output a difference between two input signals. More specifically, for example, the output buffer 204-1 is connected to the I-phase path via which the I-phase signal from the IQ mixer 201-1 is output and the IB-phase path via which the IB-phase signal from the IQ mixer 201-2 is output, and the output buffer 204-1 outputs the difference between the I-phase signal and the IB-phase signal. That is, each of the output buffers 204-1 to 204-4 outputs the difference between two signals which are opposite in phase to each other.

Thus, the output buffers 204-1 to 204-4 each output the difference between the two signals opposite in phase output from the circuits respectively having the downward-shifted frequency characteristic and the upward-shifted frequency characteristic.

In the example described above, the output buffers are configured to output the difference between signals that are opposite in phase. However, alternatively, the output buffers may be configured such that a signal output from each buffer is the difference between signals that are in phase, or a signal equal to the sum of signals that are in phase, or a signal equal to the sum of signals that are opposite in phase.

For example, in the case where the output buffers are configured to output a signal equal to the sum of signals that are in phase, the output buffers may be connected to paths such that one of the signals output from the IQ mixer 201-1 and the one of the signals output from the IQ mixer 201-2 which are in phase are connected to one of the output buffers, and such that the output buffer outputs the sum of the two input signals. More specifically, for example, the output buffer 204-1 may be connected to the I-phase path via which the I-phase signal from the IQ mixer 201-1 is output and the I-phase path via which the I-phase signal from the IQ mixer 201-2 is output such that the sum of the I-phase signals from the respective IQ mixers is output from the output buffer 204-1.

Figure 8:
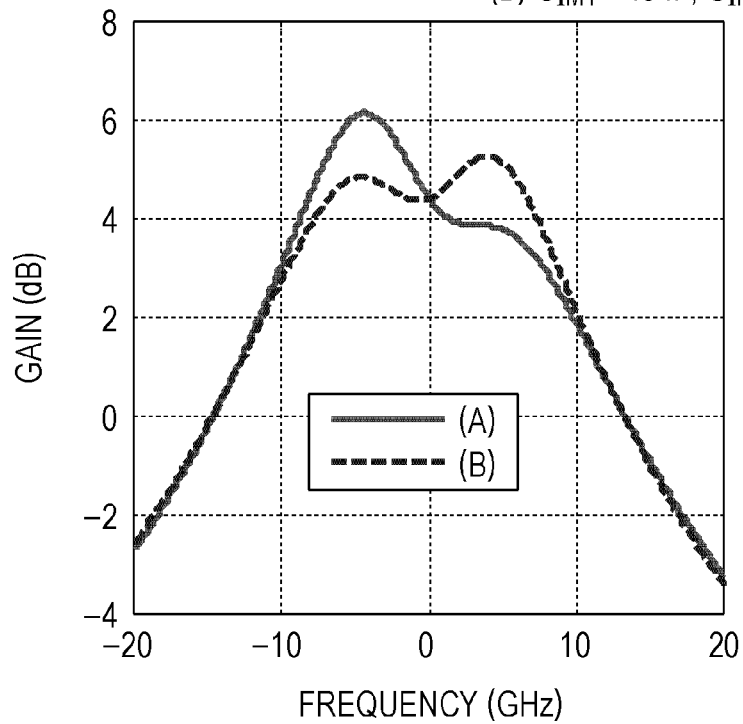
FIG. 8 is a graph illustrating a result of a circuit simulation in terms of a frequency characteristic of the equalizer circuit according to the second embodiment.

The frequency characteristic of the equalizer circuit 200 is described in further detail below. FIG. 8 is a diagram illustrating a result of circuit simulation of the equalizer circuit 200 in terms of a frequency characteristic according to the second embodiment. In FIG. 8, a horizontal axis represents an output frequency and a vertical axis represents a gain. Note that the output frequency is given by an input frequency—$f_{CK}$. FIG. 8 shows the result of the circuit simulation of the equalizer circuit 200 in terms of the frequency characteristic for fixed values of $C_S$=50 fF, $f_{CK}$=60 GHz, and $g_m$=10 mS and for following two sets of values of capacitance of phase-to-phase capacitors: (1) $C_{IM1}$=30 fF and $C_{IM2}$=40 fF (solid line (A) in FIG. 8); and (2) $C_{IM1}$=40 fF and $C_{IM2}$=30 fF (broken line (B) in FIG. 8). Herein $C_{IM1}$ denotes the capacitance value of the phase-to-phase capacitor 1022 in the phase-to-phase connection circuit 202-1, and $C_{IM2}$ denotes the capacitance value of the phase-to-phase capacitor 1022 in the phase-to-phase connection circuit 202-1.

As shown in FIG. 8, the equalizer circuit 200 is capable of achieving a frequency characteristic in which the gain peak position is shifted toward a lower frequency from the center frequency and a frequency characteristic in which the gain peak position is shifted toward a higher frequency from the center frequency. That is, the equalizer circuit 200 is capable of achieving a frequency characteristic having ripples in the passband and being asymmetric about the center frequency.

Note that in the equalizer circuit 200, $C_{IM1}$ and $C_{IM2}$ may be fixed, and $C_{S1}$ and $C_{S2}$ may be varied. $C_{S1}$ is the capacitance value of the IQ mixer 201-1, and $C_{S2}$ is the capacitance value of the IQ mixer 201-1. In the equalizer circuit 200 shown in FIG. 7, by way of example, two equalizer circuits 100 shown in FIG. 4A are connected. Alternatively, in the equalizer circuit 200, three or more equalizer circuits 100 may be connected.

Note that in FIG. 7, the order of inputting the control signals to the phase-to-phase connection circuit 202-1 is opposite to the order of inputting the control signals to the phase-to-phase connection circuit 202-2. However, depending on a frequency characteristic to be achieved, the order of inputting the control signals to the phase-to-phase connection circuit 202-1 may be the same as the order of inputting the control signals to the phase-to-phase connection circuit 202-2.

Depending on a frequency characteristic to be corrected, the TA (TA 1011 shown in FIG. 4B) in the IQ mixer may be shared.

Effects

According to the present embodiment, as described above, by connecting a plurality of equalizer circuits configured according to the first embodiment, it is possible to achieve a frequency characteristic having ripples in the passband and being asymmetric about the center frequency. Thus, the equalizer circuit 200 according to the present embodiment is capable of reducing an in-band deviation in a frequency characteristic of a multistage RF amplifier with a gain peak different from a target gain peak, or a frequency characteristic of a transmission path having ripples in a band so as to reduce an in-band deviation.

Third Embodiment

Next, a third embodiment of the present disclosure is described below. In an equalizer circuit according to this third embodiment, it is possible to achieve a characteristic similar to that of the equalizer circuit 100 according to the first embodiment in a simpler form than in the first embodiment.

Configuration and Operation of Equalizer Circuit 300

Figure 9:
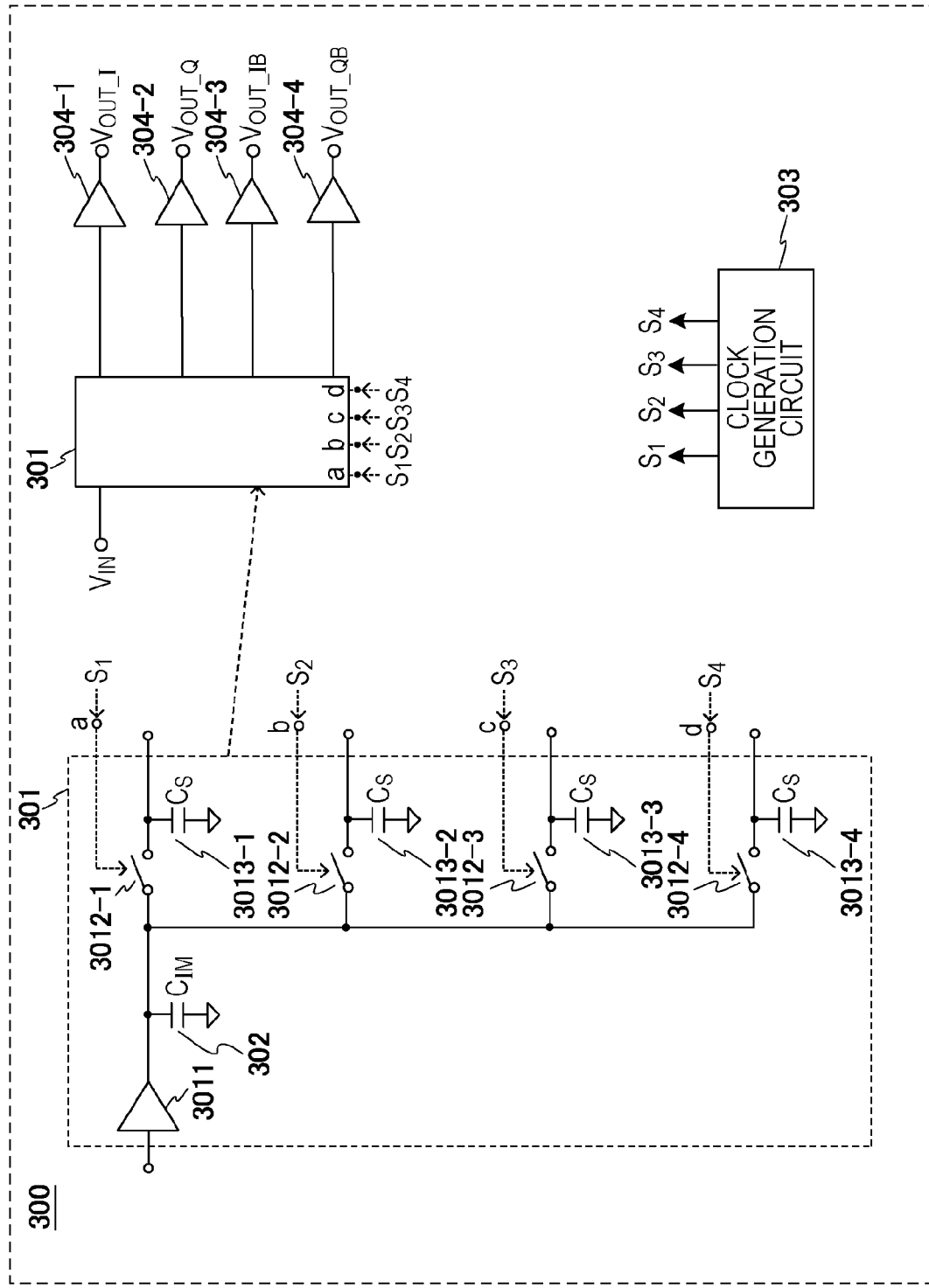
FIG. 9 is a circuit diagram illustrating an example of a circuit configuration of an equalizer circuit according to a third embodiment.

FIG. 9 is a diagram illustrating an example of a configuration of an equalizer circuit 300 according to the third embodiment. The equalizer circuit 300 shown in FIG. 9 includes an IQ mixer 301 including an phase-to-phase capacitor 302, a clock generation circuit 303, and output buffers 304-1 to 304-4. The configuration of the equalizer circuit 300 is similar to the configuration of the equalizer circuit 100 described above except that instead of the phase-to-phase connection circuit 102 in the equalizer circuit 100 shown in FIGS. 4A to 4C, an phase-to-phase capacitor 302 is connected to an output terminal of a TA 3011 in an IQ mixer 301, and thus a further detailed description thereof is omitted. The clock generation circuit 303 is similar to the clock generation circuit 103 shown in FIG. 4A.

The present embodiment is different from the first embodiment in that the phase-to-phase capacitor 302 is connected to the output terminal of the TA 3011 in the IQ mixer 301. That is, the phase-to-phase capacitor 302 is disposed in the IQ mixer 301, and the phase-to-phase connection circuit according to the first embodiment is not included in the equalizer circuit 300 according to the present embodiment.

In an initial state before the operation of the equalizer circuit 300 is started, a charge accumulated ¼ period before remains in the phase-to-phase capacitor 302.

Operation of Equalizer Circuit 300

Next, an operation of the equalizer circuit 300 is described below.

The equalizer circuit 300 performs charge sharing and charge accumulation every period $T_{CK}$ as with the equalizer circuit 100 according to the first embodiment. The equalizer circuit 300 performs the charge sharing for the following three types of charges:

(2-a) Charge associated with a current to which the input voltage signal $V_{IN}$ is converted by the TA 3011 (hereinafter, this charge will be referred to as an input charge);
(2-b) Charge stored in the phase-to-phase capacitor 302; and
(2-c) Charge stored in the sample capacitor 3013.

The equalizer circuit 300 turns on/off the switches 3012-1 to 3012-4 under the control of control signals $S_1$ to $S_4$ shown in FIG. 5 so as to perform four operations described below in one period (1$T_{CK}$) and repeats these operations every period $T_{CK}$.

First operation: During a period in which the control signal $S_1$ is at the high level, the input charge is accumulated in the phase-to-phase capacitor 302 and the sample capacitor 3013-1. At a point of time immediately before the charge accumulation described above starts, a charge obtained ¼ period before remains in the phase-to-phase capacitor 302, and a charge obtained one period before remains in the sample capacitor 3013-1. At the same time as the input charge is accumulated, the charge sharing is performed between the phase-to-phase capacitor 302 and the sample capacitor 3013-1.

Second operation: During a period in which the control signal $S_2$ is at the high level, the input charge is accumulated in the phase-to-phase capacitor 302 and the sample capacitor 3013-2. At a point of time immediately before the charge accumulation described above starts, a charge obtained ¼ period before remains in the phase-to-phase capacitor 302, and a charge one period before remains in the sample capacitor 3013-2. At the same time as the input charge is accumulated, the charge sharing is performed between the phase-to-phase capacitor 302 and the sample capacitor 3013-2.

Third operation: During a period in which the control signal $S_3$ is at the high level, the input charge is accumulated in the phase-to-phase capacitor 302 and the sample capacitor 3013-3. At a point of time immediately before the charge accumulation described above starts, a charge obtained ¼ period before remains in the phase-to-phase capacitor 302, and a charge obtained one period before remains in the sample capacitor 3013-3. At the same time as the input charge is accumulated, the charge sharing is performed between the phase-to-phase capacitor 302 and the sample capacitor 3013-3.

Fourth operation: During a period in which the control signal $S_4$ is at the high level, the input charge is accumulated in the phase-to-phase capacitor 302 and the sample capacitor 3013-4. At a point of time immediately before the charge accumulation described above starts, a charge obtained ¼ period before remains in the phase-to-phase capacitor 302, and a charge obtained one period before remains in the sample capacitor 3013-4. At the same time as the input charge is accumulated, the charge sharing is performed between the phase-to-phase capacitor 302 and the sample capacitor 3013-4.

The output buffers 304-1 to 304-4, in the respective four phases of the I-phase, the Q-phase, the IB-phase, and the QB-phase, receive continuous voltage changes resulting from the accumulation of input charges and instantaneous voltage changes resulting from the charge sharing between the sample capacitor and the phase-to-phase capacitor, and these voltage changes are output directly or after being multiplied with a constant factor thereby providing output voltage signals.

The equalizer circuit 300 performs the first operation, the second operation, the third operation, and the fourth operation repeatedly every period $T_{CK}$. By repeating the first to fourth operations sequentially, the input charge is accumulated sequentially, and cyclically, in the sample capacitors 3013-1, 3013-2, 31013-3, and 3013-4, and the phase-to-phase capacitor 302 performs charge sharing sequentially with the sample capacitors 3013-1, 3013-2, 3013-3, and 3013-4. In this case, the order of accumulating the input charge is the same as the order of performing the charge sharing, and the timing of accumulating the input charge is the same as the timing of performing the charge sharing.

In the first to fourth operations, mathematical expressions of the discrete system of the core of the frequency characteristic are similar to those according to the first embodiment. This makes it possible to achieve the transfer function $H_D$ including a complex term including an imaginary unit j as in the first embodiment. Therefore, the equalizer circuit 300 is capable of achieving a frequency characteristic similar to that shown in FIG. 6A.

Effects

According to the present embodiment, as described above, it is possible to realize a filter, such as that shown in FIG. 6A, having a frequency characteristic asymmetric about a center frequency and being adjustable in terms of the in-band deviation. That is, according to the present embodiment, it is possible to reduce, for example, the in-band deviation such as that shown in FIG. 1A which may occur owing to a frequency characteristic of a RF circuit. Furthermore, by connecting the phase-to-phase capacitor 302 to the output node of the TA 3011, it is possible to achieve a characteristic similar to that achieved according to the first embodiment in a simpler configuration than in the first embodiment.

Fourth Embodiment

Next, a fourth embodiment of the present disclosure is described below. In a circuit according to this third embodiment, a plurality of phase-to-phase connection circuits 102 of the equalizer circuits 100 according to the first embodiment are connected.

Configuration of Equalizer Circuit 400

Figure 10:
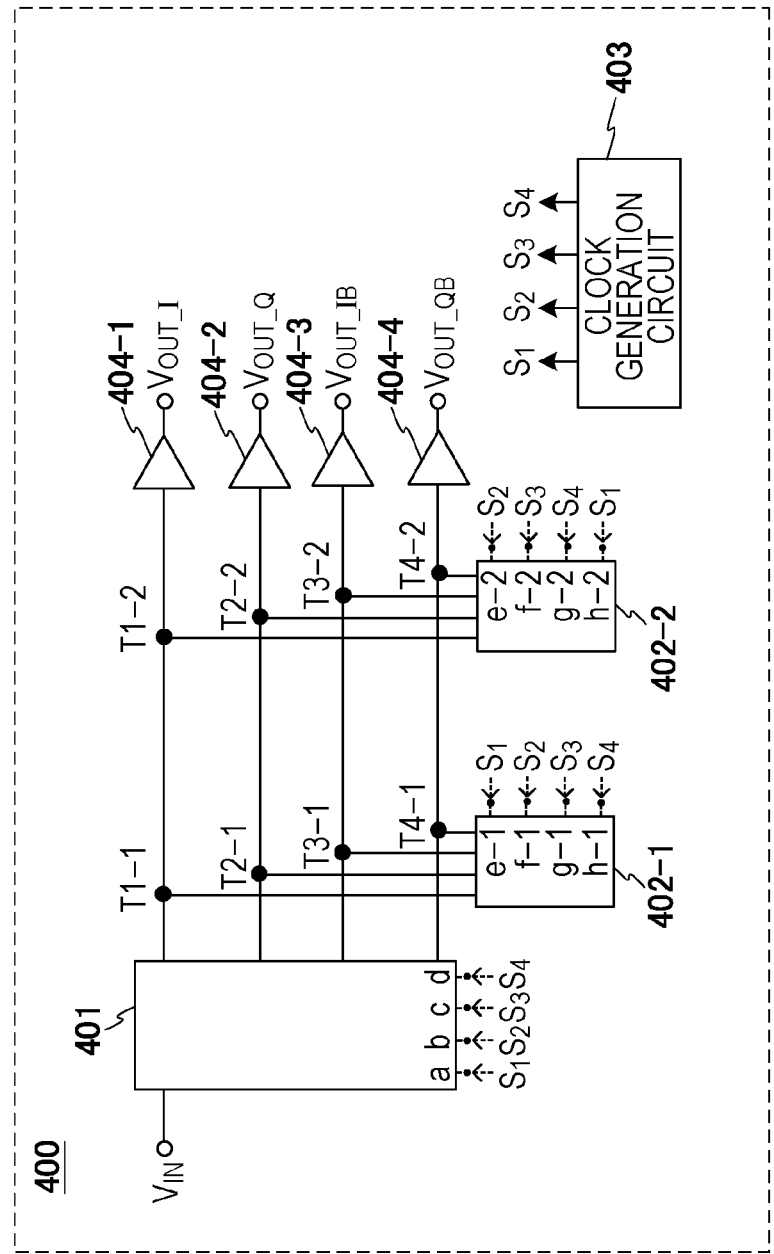
FIG. 10 is a circuit diagram illustrating an example of a circuit configuration of an equalizer circuit according to a fourth embodiment.

FIG. 10 is a diagram illustrating an example of a configuration of an equalizer circuit 400 according to the fourth embodiment. The equalizer circuit 400 shown in FIG. 10 includes an IQ mixer 401, phase-to-phase connection circuits 402-1 and 402-2, a clock generation circuit 403, and output buffers 404-1 to 404-4. The IQ mixer 401 is similar in configuration to the IQ mixer 101 shown in FIG. 4B. The phase-to-phase connection circuits 402-1 and 402-2 are similar in configuration to the phase-to-phase connection circuit 102 shown in FIG. 4C. The clock generation circuit 403 is similar to the clock generation circuit 103 shown in FIG. 4A. The output buffers 404-1 to 404-4 are respectively similar to the output buffers 104-1 to 104-4 shown in FIG. 4A.

That is, the configuration of the equalizer circuit 400 is similar to that of the equalizer circuit 100 according to the first embodiment except that one phase-to-phase connection circuit is added.

Configuration of Equalizer Circuit 500

Figure 11:
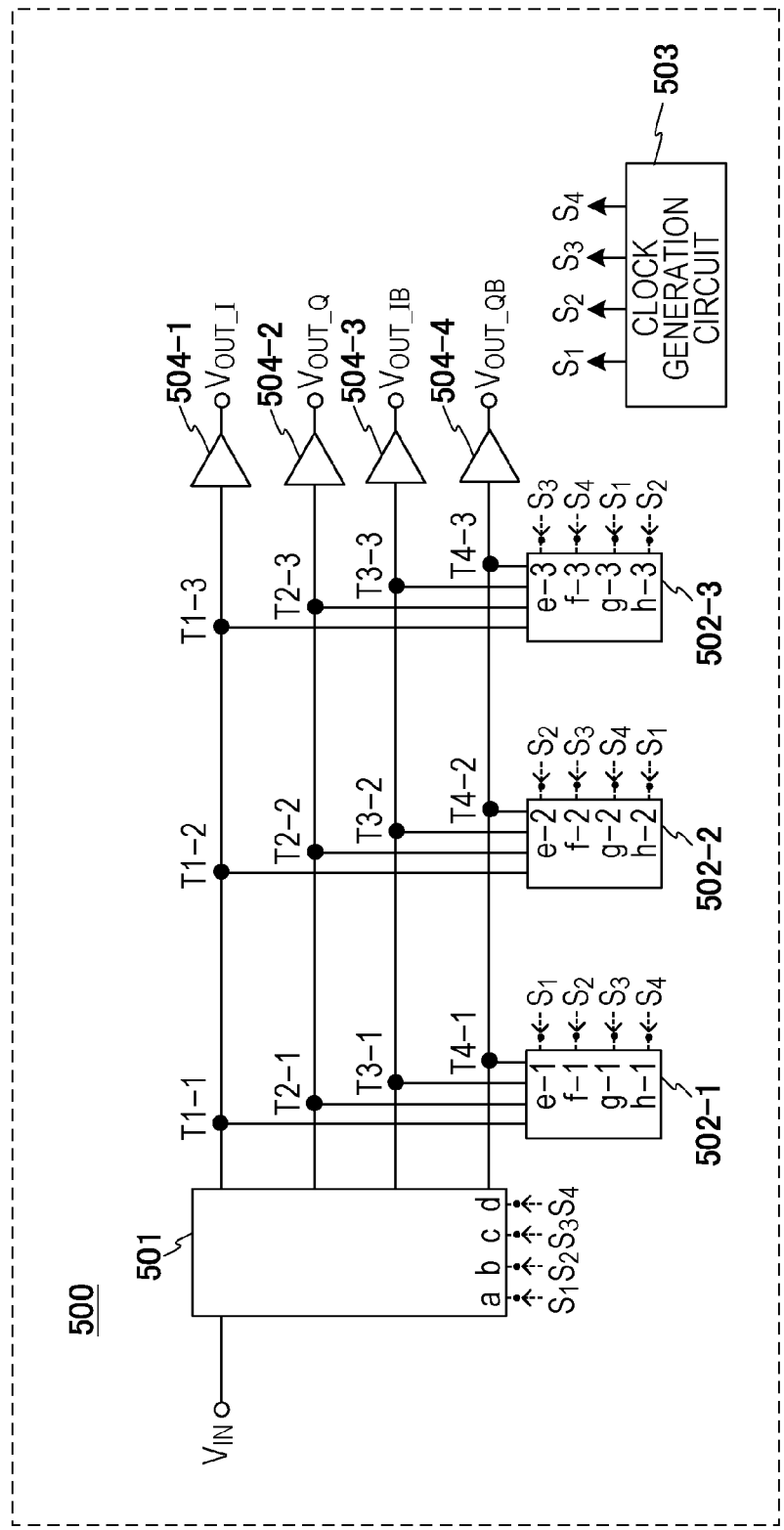
FIG. 11 is a circuit diagram illustrating an example of a circuit configuration of an equalizer circuit according to the fourth embodiment.

FIG. 11 is a diagram illustrating an example of a configuration of an equalizer circuit 500 according to the fourth embodiment. The equalizer circuit 500 shown in FIG. 11 includes an IQ mixer 501, phase-to-phase connection circuits 502-1, 502-2, and 502-3, a clock generation circuit 503, and output buffers 504-1 to 504-4. The IQ mixer 501 is similar in configuration to the IQ mixer 101 shown in FIG. 4B. The phase-to-phase connection circuits 502-1, 502-2, and 502-3 are similar in configuration to the phase-to-phase connection circuit 102 shown in FIG. 4C. The clock generation circuit 503 is similar to the clock generation circuit 103 shown in FIG. 4A. The output buffers 504-1 to 504-4 are respectively similar to the output buffers 104-1 to 104-4 shown in FIG. 4A.

That is, the configuration of the equalizer circuit 500 is similar to that of the equalizer circuit 100 according to the first embodiment except that two phase-to-phase connection circuit are added.

Configuration of Equalizer Circuit 600

Figure 12:
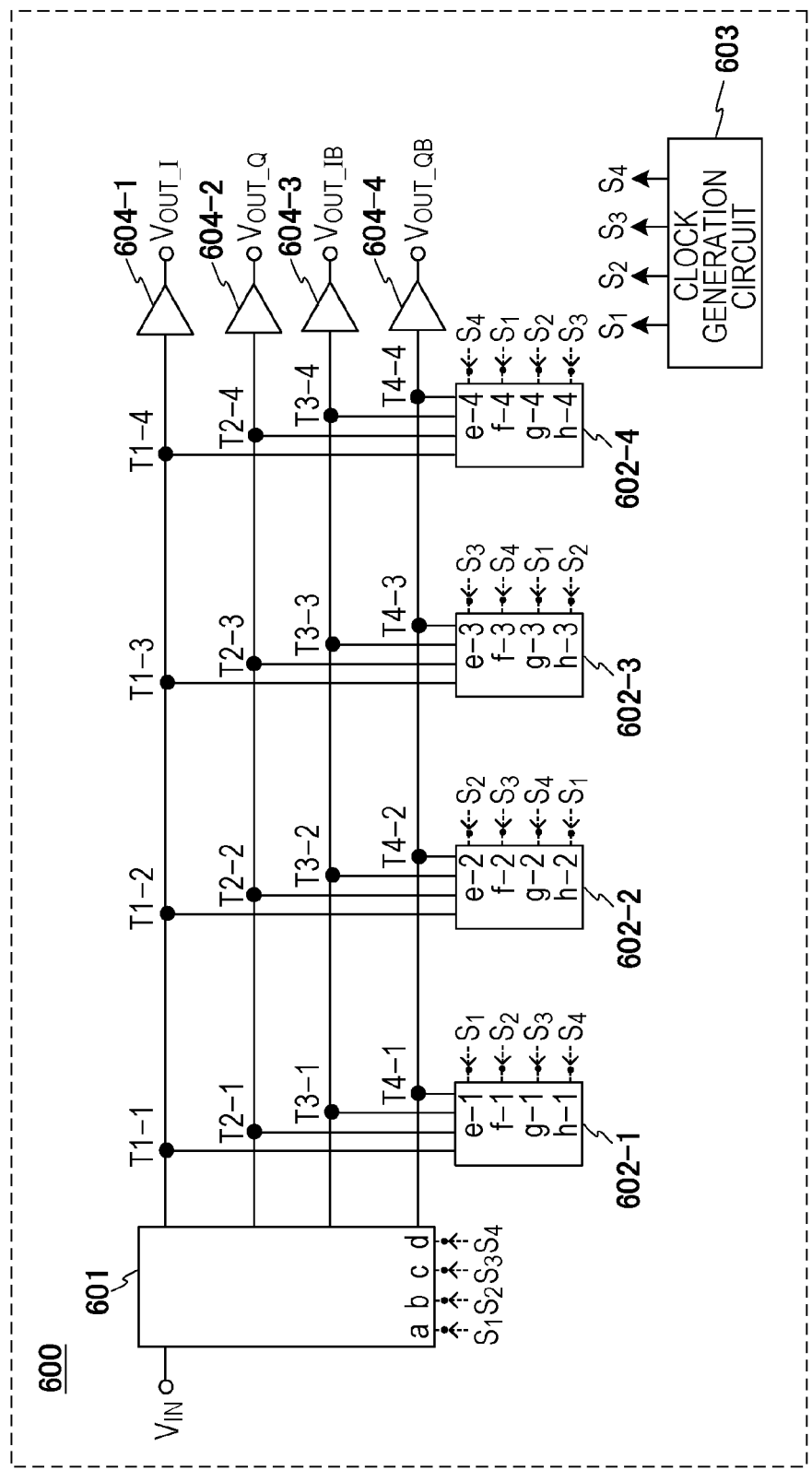
FIG. 12 is a circuit diagram illustrating an example of a circuit configuration of an equalizer circuit according to the fourth embodiment.

FIG. 12 is a diagram illustrating an example of a configuration of an equalizer circuit 600 according to the fourth embodiment. The equalizer circuit 600 shown in FIG. 12 includes an IQ mixer 601, phase-to-phase connection circuits 602-1, 602-2, 602-3, and 602-4, a clock generation circuit 603, and output buffers 604-1 to 604-4. The IQ mixer 601 is similar in configuration to the IQ mixer 101 shown in FIG. 4B. The phase-to-phase connection circuits 602-1 and 602-4 are similar in configuration to the phase-to-phase connection circuit 102 shown in FIG. 4C. The clock generation circuit 603 is similar to the clock generation circuit 103 shown in FIG. 4A. The output buffers 604-1 to 604-4 are respectively similar to the output buffers 104-1 to 104-4 shown in FIG. 4A.

That is, the configuration of the equalizer circuit 600 is similar to that of the equalizer circuit 100 according to the first embodiment except that three more phase-to-phase connection circuits are added.

The control signals input to the plurality of phase-to-phase connection circuits of the equalizer circuits 400, 500, and 600 are different depending on the phase-to-phase connection circuits, and thus the timing of turning on the switches 1021-1 to 1021-4 of each phase-to-phase connection circuit in the equalizer circuits 400, 500, and 600 is different among the phase-to-phase connection circuits. For example, in the equalizer circuit 400, the control signal $S_1$ is input to the terminal e of the phase-to-phase connection circuit 402-1, and thus the switch 1021-1 of the phase-to-phase connection circuit 402-1 is in the ON-state during the period in which the control signal $S_1$ is at the high level. On the other hand, the control signal $S_2$ is input to the terminal e of the phase-to-phase connection circuit 402-2, and thus the switch 1021-1 of the phase-to-phase connection circuit 402-2 is in the ON-state during the period in which the control signal $S_2$ is at the high level. That is, in the equalizer circuit 400, the switch 1021-1 disposed in each of the phase-to-phase connection circuits 402-1 and 402-2 is turned on with timing different from each other. The switches 1021-2, 1021-3, and 1021-4 are turned on in a similar manner for the phase-to-phase connection circuits 402-1 and 402-2 and for the equalizer circuits 500 and 600.

Although the timing of turning on the switches 1021-1 to 1021-4 in each phase-to-phase connection circuit of the equalizer circuits 400, 500, and 600 is different depending on the phase-to-phase connection circuit, the order of sequentially turning on the switches 1021-1 to 1021-4 in each phase-to-phase connection circuit is the same for all phase-to-phase connection circuits. That is, the connection order of the phase-to-phase capacitor is the same as the phase rotation order I-phase, Q-phase, IB-phase, QB-phase. The order of the charge sharing between the phase-to-phase capacitor and the sample capacitors is the same as the order of the input charge accumulation in the sample capacitors.

In the case of the equalizer circuit 600, the input charge accumulation is performed sequentially, and cyclically, in the order sample capacitors 1013-1, 1013-2, 1013-3, and 1013-4.

The phase-to-phase capacitor 1022 of the phase-to-phase connection circuit 602-1 is connected sequentially and cyclically to the sample capacitors 1013-1, 1013-2, 1013-3, and 1013-4 of the IQ mixer 601 and the charge sharing therewith is performed. The phase-to-phase capacitor 1022 of the phase-to-phase connection circuit 602-2 is connected sequentially, and cyclically, to the sample capacitors 1013-2, 1013-3, 1013-4, and 1013-1 of the IQ mixer 601 and the charge sharing therewith is performed. The phase-to-phase capacitor 1022 of the phase-to-phase connection circuit 602-3 is connected sequentially and cyclically to the sample capacitors 1013-3, 1013-4, 1013-1, and 1013-2 of the IQ mixer 601 and the charge sharing therewith is performed. The phase-to-phase capacitor 1022 of the phase-to-phase connection circuit 602-4 is connected sequentially and cyclically to the sample capacitors 1013-4, 1013-1, 1013-2, and 1013-3 of the IQ mixer 601 and the charge sharing therewith is performed.

In the equalizer circuits 400, 500, and 600, the connection order of the phase-to-phase capacitor is the same as the phase rotation order I-phase, Q-phase, IB-phase, QB-phase, and thus the equalizer circuits 400, 500, and 600 are capable of achieving a frequency characteristic in which the gain peak position is shifted toward a lower frequency from the center frequency as is achieved according to the first embodiment. It is possible to increase the amount of shift by increasing the number of connections of the phase-to-phase connection circuit.

By inputting control signals to the respective phase-to-phase connection circuits such that the phase-to-phase capacitor is connected in an order opposite to the phase rotation order I-phase, Q-phase, IB-phase, QB-phase, it is possible to achieve an equalizer circuit having a frequency characteristic in which the gain peak position is shifted to a higher frequency from the center frequency.

Figure 13:
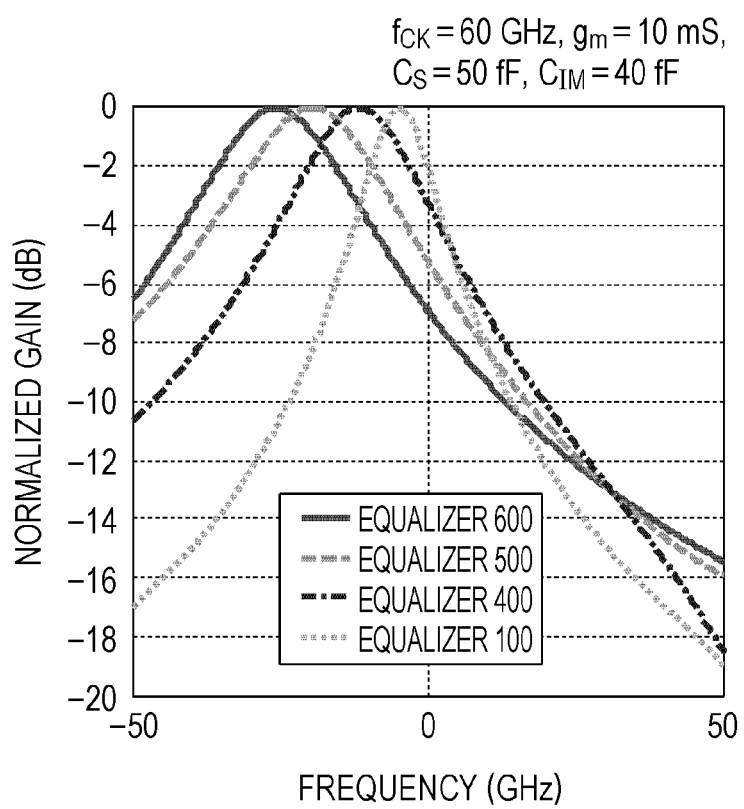
FIG. 13 is a graph illustrating a result of a circuit simulation in terms of a frequency characteristic of the equalizer circuit according to the fourth embodiment.

Specific examples of the frequency characteristics of the equalizer circuits 400, 500, and 600 are described below. FIG. 13 is a diagram illustrating a result of circuit simulation of the equalizer circuits 400, 500, and 600 in terms of a frequency characteristic according to the fourth embodiment. In FIG. 13, a horizontal axis represents an output frequency and a vertical axis represents a gain normalized with a maximum gain. Note that the output frequency is given by an input frequency—$f_{CK}$. In FIG. 13, for the purpose of comparison, the frequency characteristic of the equalizer circuit 100 according to the first embodiment is also shown. In FIG. 13, frequency characteristics of the equalizer circuits 100, 400, 500, and 600 are shown for the same circuit element values of $C_S$=50 fF, $f_{CK}$=60 GHz, $g_m$=10 mS, and capacitance of the phase-to-phase capacitor $C_{IM}$=40 fF.

As shown in FIG. 13, an increase in the number of phase-to-phase connection circuits of the equalizer circuit results in an increase in the number of times that the phase-to-phase capacitor is connected in each phase system of the I-phase, Q-phase, IB-phase, and QB-phase, and thus results in an increase in the amount of shift of the gain peak position from the center frequency in the frequency characteristic.

Effects

According to the present embodiment, as described above, by providing a plurality of phase-to-phase connection circuits in an equalizer circuit, it is possible to achieve a large shift of a gain peak position in a frequency characteristic using the same element values (capacitance values of sample capacitors and phase-to-phase capacitors).

Fifth Embodiment

Next, a fifth embodiment of the present disclosure is described below. In a circuit according to this fifth embodiment, a plurality of equalizer circuits according to the second and fourth embodiments are connected.

Configuration and Operation of Equalizer Circuit 700

Figure 14:
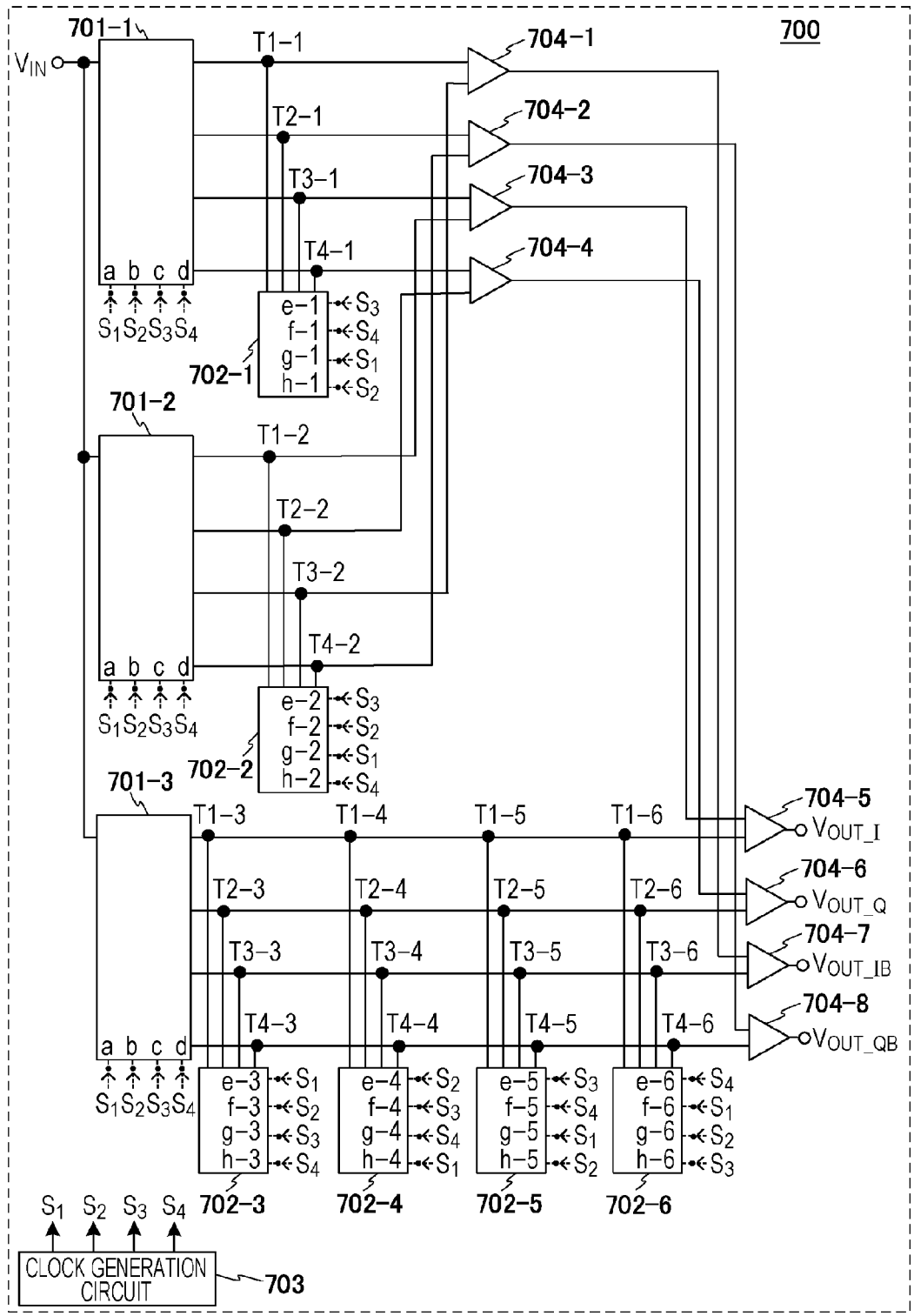
FIG. 14 is a circuit diagram illustrating an example of a circuit configuration of an equalizer circuit according to a fifth embodiment.

FIG. 14 is a diagram illustrating an example of a configuration of an equalizer circuit 700 according to the fifth embodiment. The equalizer circuit 700 shown in FIG. 14 includes IQ mixers 701-1, 701-2, and 701-3, phase-to-phase connection circuits 702-1 to 702-6, a clock generation circuit 703, and output buffers 704-1 to 704-8. The clock generation circuit 703 is similar to the clock generation circuit 103 shown in FIG. 4A.

The IQ mixer (first conversion circuit) 701-1, the IQ mixer (second conversion circuit) 701-2, and the IQ mixer (third conversion circuit) 701-3 are similar in configuration to the IQ mixer 101 shown in FIG. 4B. The phase-to-phase connection circuits 702-1 and 702-6 are similar in configuration to the phase-to-phase connection circuit 102 shown in FIG. 4C. However, control signals input to phase-to-phase connection circuits are different among the phase-to-phase connection circuit (first phase-to-phase connection circuit) 702-1, the phase-to-phase connection circuit (second phaseto-phase connection circuit) 702-2, the phase-to-phase connection circuit 702-3, the phase-to-phase connection circuit 702-4, the phase-to-phase connection circuit 702-5, and the phase-to-phase connection circuit 702-6.

The output buffers 704-1 to 704-8 are each configured to output a difference between two input signals. In the case shown in FIG. 14, each of the output buffers 704-1 to 704-8 outputs the difference between two signals which are opposite in phase to each other.

In the equalizer circuit 700, a part including the IQ mixers 701-1 and 701-2, the phase-to-phase connection circuits 702-1 and 702-2, and the output buffers 704-1 to 704-4 is configured to be similar to the equalizer circuit 200 according to the second embodiment.

Furthermore, in the equalizer circuit 700, a part including the IQ mixer 701-3 and the phase-to-phase connection circuits 702-3 to 702-6 is configured to be similar to the equalizer circuit 600 according to the fourth embodiment except for the output buffers.

That is, in the equalizer circuit 700 according to the present embodiment, the equalizer circuit 200 according to the second embodiment and the equalizer circuit 600 according to the fourth embodiment are connected in parallel. The equalizer circuit 200 according to the second embodiment is configured by connecting two equalizer circuits 100 according to the first embodiment. That is, the equalizer circuit 700 according to the present embodiment is configured by connecting three equalizer circuits. The operation of the equalizer circuit 700 is similar to that described above in the first embodiment or other embodiments, and thus a further description thereof is omitted.

Furthermore, the equalizer circuit 700 according to the present embodiment is configured such that output is a difference between an anti-phase signal of the equalizer circuit 200 according to the second embodiment and an anti-phase signal of the equalizer circuit 400 according to the fourth embodiment.

In the above-described configuration, by way of example, the difference between anti-phase signals is output. Alternatively, the output signal may be a difference between in-phase signals, a sum of in-phase signals, or a sum of anti-phase signals.

Depending on the frequency characteristic to be corrected, the TA in the IQ mixer may be shared.

Figure 15:
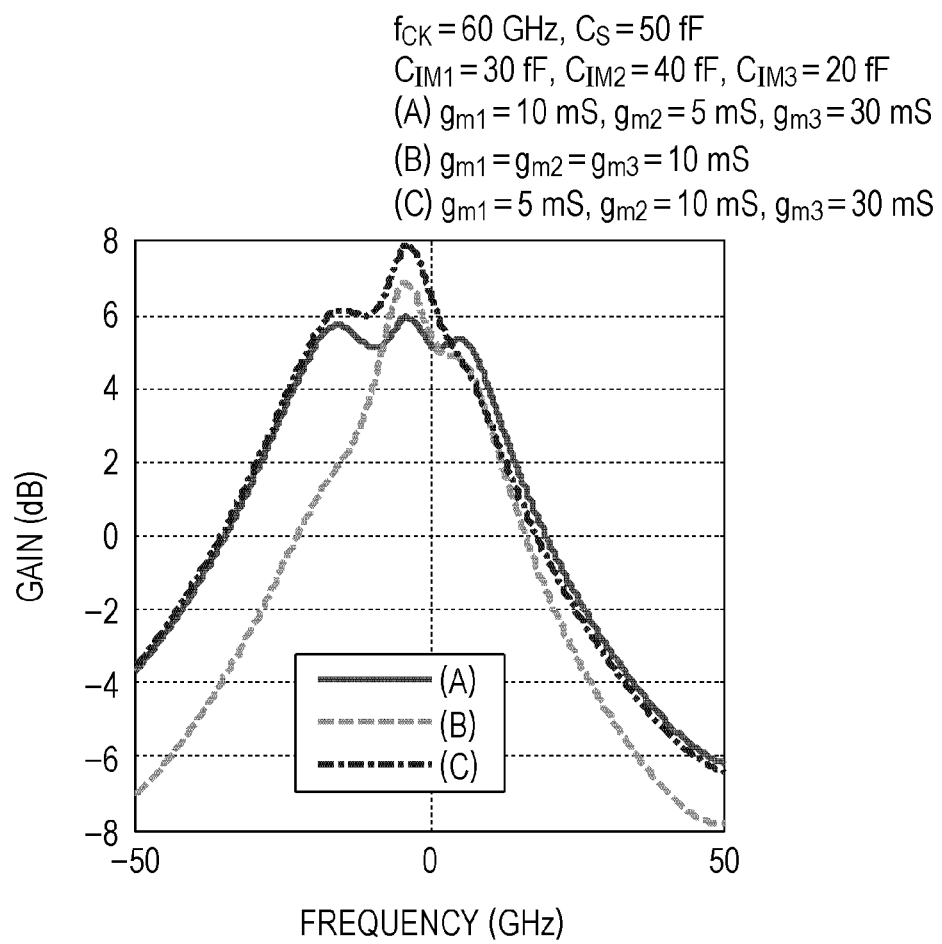
FIG. 15 is a graph illustrating a result of a circuit simulation in terms of a frequency characteristic of the equalizer circuit according to the fifth embodiment.

A specific example of a frequency characteristic of the equalizer circuit 700 is described below. FIG. 15 is a diagram illustrating a result of circuit simulation of the equalizer circuit 700 in terms of a frequency characteristic according to the fifth embodiment. In FIG. 15, a horizontal axis represents an output frequency and a vertical axis represents a gain. Note that the output frequency is given by an input frequency—$f_{CK}$. Note that $g_{m1}$, $g_{m2}$, and $g_{m3}$ denote the values employed in the simulation in terms of transconductance of the TA in the respective IQ mixers 701-1 to 701-3, and $C_{IM1}$, $C_{IM2}$, and $C_{IM3}$ denote capacitance values of the phase-to-phase capacitors in the respective phase-to-phase connection circuits 702-1 to 702-3. The capacitance values of phase-to-phase capacitors in the respective phase-to-phase connection circuits 702-4 to 702-6 are equal to the capacitance value $C_{IM3}$ of the phase-to-phase capacitor of the phase-to-phase connection circuit 702-3. FIG. 15 shows a result of the circuit simulation in terms of the frequency characteristic for fixed values of $C_S$=50 fF, $f_{CK}$=60 GHz, $C_{IM1}$=30 fF, $C_{IM2}$=40 fF, and $C_{IM3}$=20 fF and for several different values of each of $g_{m1}$, $g_{m2}$, and $g_{m3}$. In FIG. 15, a solid line (A) represents a frequency characteristics for a case where $g_{m1}$=10 mS, $g_{m2}$=5 mS, and $g_{m3}$=30 mS. In FIG. 15, a broken line (B) represents a frequency characteristics for a case where $g_{m1}$=$g_{m2}$=$g_{m3}$=10 mS. In FIG. 15, a broken line (C) represents a frequency characteristics for a case where $g_{m1}$=5 mS, $g_{m2}$=10 mS, and $g_{m3}$=30 mS. As shown in FIG. 15, by connecting three equalizer circuits, it is possible to achieve a frequency characteristic having a plurality of ripples.

Effects

According to the present embodiment, as described above, by connecting a plurality of equalizer circuits configured to perform a periodically time varying process it becomes possible to achieve a frequency characteristic having ripples in the passband and being asymmetric about the center frequency. Thus, according to the present embodiment, it is possible to reduce an in-band deviation in a frequency characteristic of a multistage RF amplifier with a gain peak different among stages, or a ripple in a band caused by a frequency characteristic of a propagation channel.

In the present embodiment described above, by way of example, the equalizer circuit 200 according to the second embodiment (or the parallel connection of two equalizer circuits 100 according to the first embodiment) and the equalizer circuit 600 according to the fourth embodiment are connected in parallel. Note that the number of equalizer circuits 100 according to the first embodiment and the number of equalizer circuits 600 according to the fourth embodiment are not limited to those described above. Furthermore, it may be allowed to make a change in terms of a leftward shift (a shift toward a lower frequency), a rightward shift (a shift toward a higher frequency), and the number of phase-to-phase connection circuits. That is, a plurality of equalizer circuits each including a particular number of phase-to-phase connection circuits may be provided in parallel, and outputs thereof may be combined together. Depending on the environment, the frequency characteristic may be adjusted by changing the number of equalizer circuits, the number of phase-to-phase connection circuits, and the leftward/rightward shift.

Sixth Embodiment

Next, a sixth embodiment of the present disclosure is described below. In this sixth embodiment, the equalizer circuit according to one of previous embodiments is modified such that the equalizer circuit includes two circuit parts, that is, an in-phase part involving an in-phase signal component and an anti-phase part involving an anti-phase signal component, and these two parts operate in a differential manner. In the differential configuration of the equalizer circuit, the in-phase and anti-phase parts are each realized using an equalizer circuit according to one of previous embodiments described above, and thus it is possible to achieve advantages and effects similar to those achieved by the respective embodiments.

Figure 16:
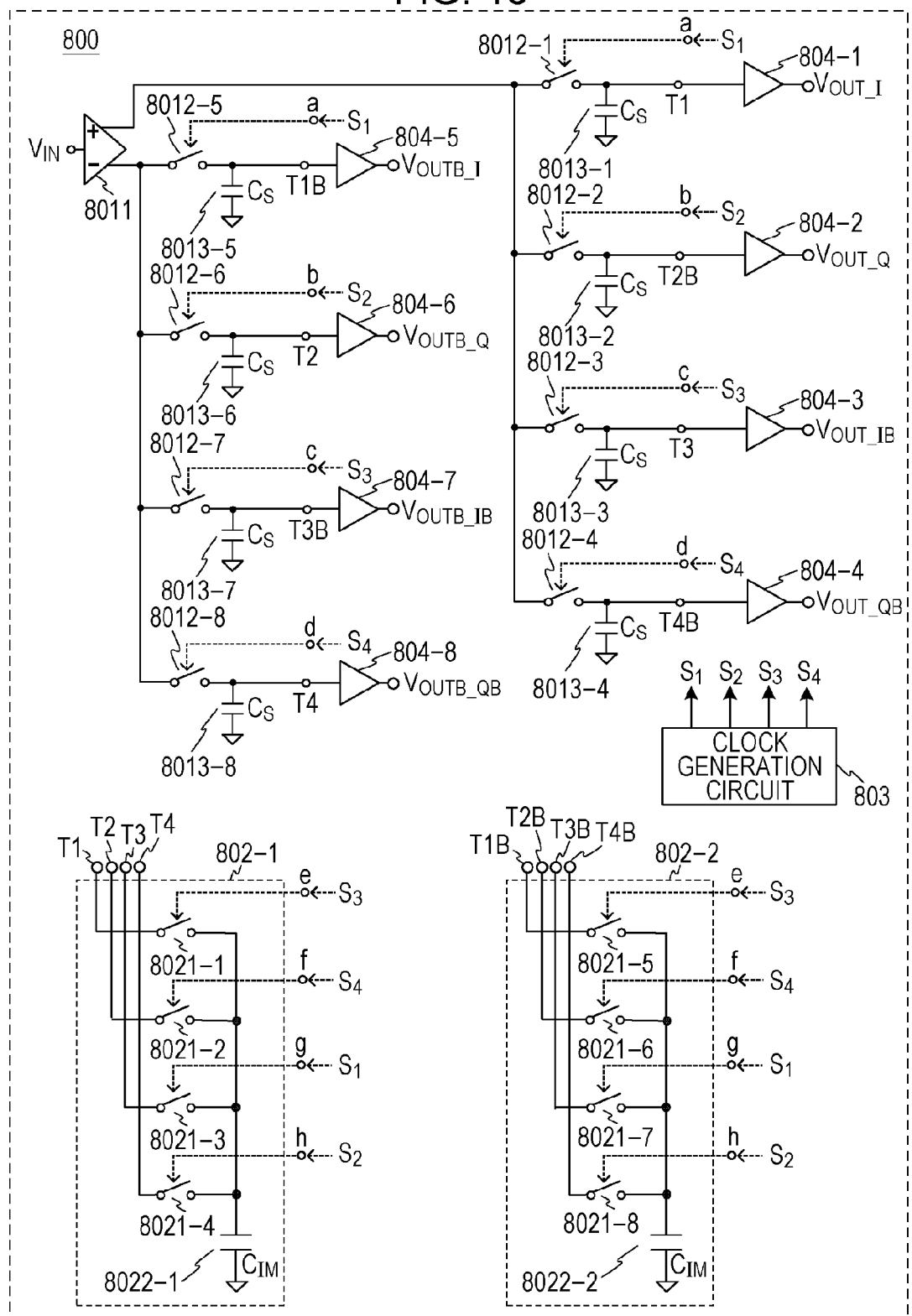
FIG. 16 is a circuit diagram illustrating an example of a circuit configuration of an equalizer circuit according to a sixth embodiment.

In the differential configuration of the equalizer circuit, the connection points of the phase-to-phase capacitor to the 4-phase connection paths including the I-phase path, the Q-phase path, the IB-phase path, and the QB-phase path in each of the in-phase part and the anti-phase part are changed such that the phase-to-phase capacitor is capable of performing the charge sharing with a phase shift of ¾ period (that is, −¼ period) while the phase-to-phase capacitor is connected in the same order as the phase rotation I-phase, Q-phase, IB-phase, and QB-phase. This causes the sign of an imaginary term in the transfer function of the equalizer to be inverted, and thus it is possible to realize an equalizer circuit having a frequency characteristic in which the gain peak position is shifted toward a high frequency from the center frequency. Referring to FIG. 16, a further detailed explanation is given below as to an example in which the equalizer circuit 100 according to the first embodiment described above is modified into a differential configuration such that the phase-to-phase capacitor performs charge sharing with a phase shift of ¾ period (that is, −¼ period) while being connected sequentially to the 4-phase connection paths in the same order as the phase rotation order I-phase, Q-phase, IB-phase, QB-phase.

FIG. 16 is a diagram illustrating an example of a configuration of an equalizer circuit 800 according to the sixth embodiment. The equalizer circuit 800 is a modification to the equalizer circuit 100 according to the first embodiment such that the equalizer circuit 800 has a differential configuration. In FIG. 16, connection lines associated with terminal T1 to T4 and terminals T1B to T4B are not shown for convenience of illustration.

A TA 8011 converts an input analog signal given as an input voltage signal $V_{IN}$ to two currents, that is, an in-phase current (denoted by a symbol+in FIG. 16) and an anti-phase current (denoted by a symbol—in FIG. 16), and outputs the resultant two currents. Hereinafter, a part of a circuit configuration involving the in-phase current will be referred to as an in-phase part, and a part of the circuit configuration involving the anti-phase current will be referred to as an anti-phase part.

In the in-phase part, switches 8012-1 to 8012-4, sample capacitors 8013-1 to 8013-4, and output buffers 804-1 to 804-4 are respectively similar to the switches 1012-1 to 1012-4, the sample capacitors 1013-1 to 1013-4, and the output buffers 104-1 to 104-4 shown in FIG. 4A or 4B. As in the first embodiment, in the in-phase part, a path via which an I-phase signal is output, a path via which a Q-phase signal is output, a path via which an IB-phase signal is output, and a path via which a QB-phase signal is output are respectively referred to as an I-phase path, a Q-phase path, an IB-phase path, and a QB-phase path in the in-phase part.

In the anti-phase part, switches 8012-5 to 8012-8, sample capacitors 8013-5 to 8013-8, and output buffers 804-5 to 804-8 are respectively similar to the switches 1012-1 to 1012-4, the sample capacitors 1013-1 to 1013-4, and the output buffers 104-1 to 104-4 shown in FIG. 4A or 4B. As in the first embodiment, in the anti-phase part, a path via which an I-phase signal is output, a path via which a Q-phase signal is output, a path via which an IB-phase signal is output, a path via which a QB-phase signal is output are respectively referred to as an I-phase path, a Q-phase path, an IB-phase path, and a QB-phase path in the anti-phase part.

The clock generation circuit 803 is similar to the clock generation circuit 103 shown in FIG. 4A and is configured to supply 4-phase control signals $S_1$, $S_2$, $S_3$, and $S_4$ shown in FIG. 5.

The phase-to-phase connection circuits 802-1 and 802-2 are similar in configuration to the phase-to-phase connection circuit 102 shown in FIG. 4C. However, connection points of the terminals T1 to T4 of the phase-to-phase connection circuit 802-1 and connection points of the terminals T1B to T4B of the phase-to-phase connection circuit 802-2 are different from the connection points of the terminals T1 to T4 of the phase-to-phase connection circuit 102. The difference in the connection points of the terminals of the phase-to-phase connection circuits results in a difference in operation of the equalizer circuit 800 as described below.

The equalizer circuit 800 turns on/off the switches 8012-1 to 8012-8 and the switches 8021-1 to 8021-8 under the control of control signals $S_1$ to $S_4$ shown in FIG. 5 so as to perform four operations described below in one period ($1T_{CK}$) and repeats these operations every period $T_{CK}$.

First operation: During a period in which the control signal $S_1$ is at the high level, the sample capacitor 8013-1 is connected to the in-phase output of the TA 8011, and the input charge is accumulated in the sample capacitor 8013-1. In this period, the sample capacitor 8013-5 is connected to the anti-phase output of the TA 8011, and the input charge is accumulated in the sample capacitor 8013-5. At a point of time immediately before the charge accumulation described above is started, charges obtained one period before remain in the respective sample capacitors 8013-1 and 8013-5. At the same time as the input charges are accumulated in the sample capacitors 8013-1 and 8013-5, the phase-to-phase capacitor 8022-1 is connected to the sample capacitor 8013-3, and the phase-to-phase capacitor 8022-2 is connected to the sample capacitor 8013-7, and the charge sharing is performed between respective capacitors connected together.

Second operation: During a period in which the control signal $S_2$ is at the high level, the sample capacitor 8013-2 is connected to the in-phase output of the TA 8011, and the input charge is accumulated in the sample capacitor 8013-2. In this period, the sample capacitor 8013-6 is connected to the anti-phase output of the TA 8011, and the input charge is accumulated in the sample capacitor 8013-6. At a point of time immediately before the charge accumulation described above is started, a charge obtained one period before remains in the respective sample capacitors 8013-2 and 8013-6. At the same time as the input charges are accumulated in the sample capacitors 8013-2 and 8013-6, the phase-to-phase capacitor 8022-1 is connected to the sample capacitor 8013-8, and the phase-to-phase capacitor 8022-2 is connected to the sample capacitor 8013-4, and the charge sharing is performed between respective capacitors connected together.

Third operation: During a period in which the control signal $S_3$ is at the high level, the sample capacitor 8013-3 is connected to the in-phase output of the TA 8011, and the input charge is accumulated in the sample capacitor 8013-3. In this period, the sample capacitor 8013-7 is connected to the anti-phase output of the TA 8011, and the input charge is accumulated in the sample capacitor 8013-7. At a point of time immediately before the charge accumulation described above is started, charges obtained one period before remain in the respective sample capacitors 8013-3 and 8013-7. At the same time as the input charges are accumulated in the sample capacitors 8013-3 and 8013-7, the phase-to-phase capacitor 8022-1 is connected to the sample capacitor 8013-1, and the phase-to-phase capacitor 8022-2 is connected to the sample capacitor 8013-5, and the charge sharing is performed between respective capacitors connected together.

Fourth operation: During a period in which the control signal $S_4$ is at the high level, the sample capacitor 8013-4 is connected to the in-phase output of the TA 8011, and the input charge is accumulated in the sample capacitor 8013-4. In this period, the sample capacitor 8013-8 is connected to the anti-phase output of the TA 8011, and the input charge is accumulated in the sample capacitor 8013-8. At a point of time immediately before the charge accumulation described above is started, a charge obtained one period before remains in the respective sample capacitors 8013-4 and 8013-8. At the same time as the input charges are accumulated in the sample capacitors 8013-4 and 8013-8, the phase-to-phase capacitor 8022-1 is connected to the sample capacitor 8013-6, and the phase-to-phase capacitor 8022-2 is connected to the sample capacitor 8013-2, and the charge sharing is performed between respective capacitors connected together.

The equalizer circuit 800 sequentially performs the first operation, the second operation, the third operation, and the fourth operation and repeats these operations every period $T_{CK}$. By repeating the sequential operations of the first to fourth operations, the input charge accumulation in the in-phase part is performed sequentially and cyclically in the sample capacitors 8013-1, 8013-2, 8013-3, and 8013-4. The phase-to-phase capacitor 8022-1 is connected sequentially and cyclically to 4-phase connection paths in the order the IB-phase path in the in-phase part, the QB-phase path in the anti-phase part, the I-phase path in the in-phase part, the Q-phase path in the anti-phase part. During this sequential connection process, the phase-to-phase capacitor 8022-1 performs charge sharing sequentially with the sample capacitors 8013-3, 8013-8, 8013-1, and 8013-6. On the other hand, the phase-to-phase capacitor 8022-2 is connected sequentially and cyclically to 4-phase connection paths in the order the IB-phase path in the anti-phase part, the QB-phase path in the in-phase part, the I-phase path in the anti-phase part, the Q-phase path in the in-phase part. During this sequential connection process, the phase-to-phase capacitor 8022-2 performs charge sharing sequentially with the sample capacitors 8013-7, 8013-4, 8013-5, and 8013-2.

There is a phase difference of 180° between the in-phase part and the anti-phase part in each path. For example, the phase of the signal on the QB-phase path in the anti-phase part is the same as the phase of the Q-phase signal in the in-phase part. The phase of the signal on the QB-phase path in the in-phase part, is the same as the phase of the Q-phase signal in the anti-phase part. That is, the order the IB-phase path in the in-phase part, the QB-phase path in the anti-phase part, the I-phase path in the in-phase part, the Q-phase path in the anti-phase part, in the sequential connection of the phase-to-phase capacitor 8022-1, is equivalent to the order the IB-phase path in the in-phase part, the Q-phase path in the in-phase part, the I-phase path in the in-phase part, the QB-phase path in the in-phase part in the sequential connection of the phase-to-phase capacitor 8022-1. This applies also to the phase-to-phase capacitor 8022-2. Therefore, while making connection in the same order as the order of the phase rotation I-phase, Q-phase, IB-phase, QB-phase, the phase-to-phase capacitor is capable of performing the charge sharing with a phase shift of ¾ period (that is, −¼ period). This causes an inversion of the sign of an imaginary term in the transfer function of the equalizer circuit 800 according to the sixth embodiment, and thus it is possible to realize a frequency characteristic in which the gain peak position is shifted toward a high frequency from the center frequency.

Seventh Embodiment

Next, a seventh embodiment of the present disclosure is described below. In this seventh embodiment, clocks (control signals) are input to the IQ mixer 101 and the phase-to-phase connection circuit 102 of the equalizer circuit 100 according to the first embodiment in a different manner from that according to the first embodiment.

Configuration and Operation of Equalizer Circuit 900

Figure 17A:
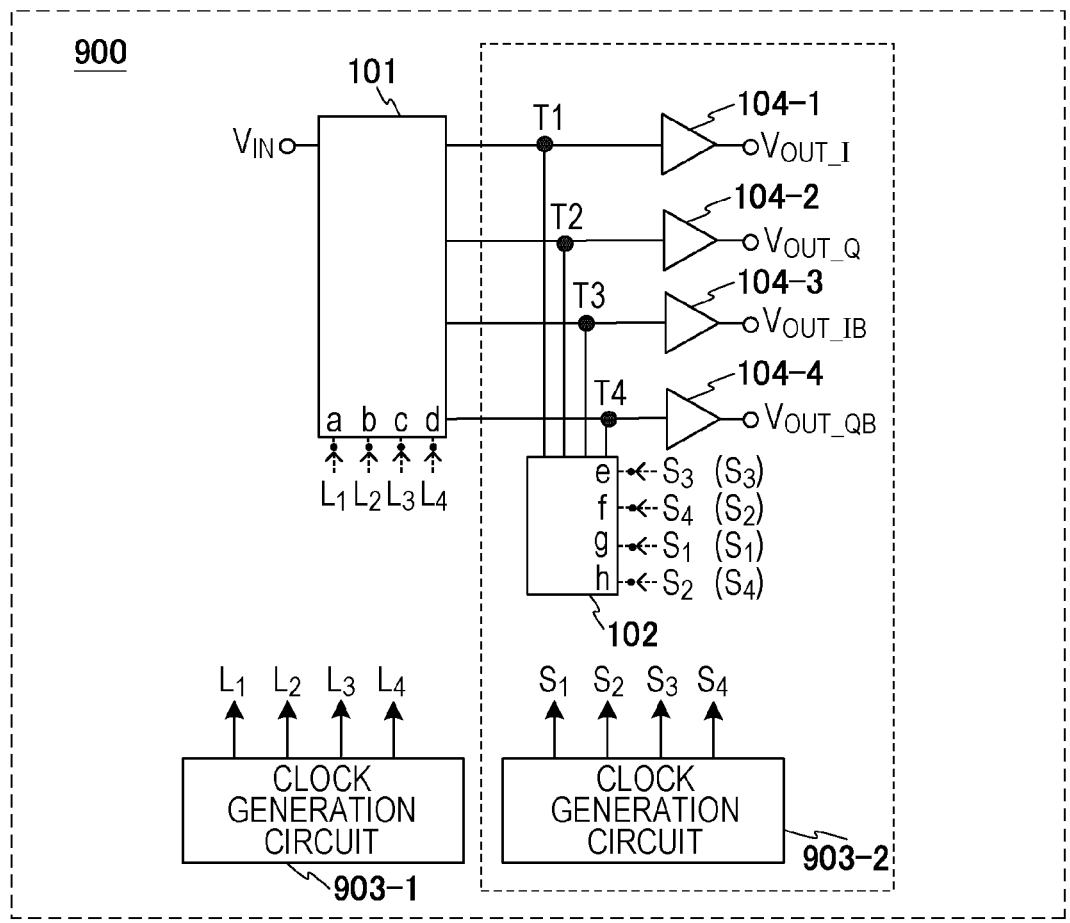
FIG. 17A is a circuit diagram illustrating an example of a circuit configuration of an equalizer circuit according to a seventh embodiment.

FIG. 17A is a diagram illustrating an example of a configuration of an equalizer circuit 900 according to the seventh embodiment. In the equalizer circuit 900, an IQ mixer 101, an phase-to-phase connection circuit 102, and output buffers 104 are similar in configuration to those of the equalizer circuit 100 shown in FIG. 4A. The equalizer circuit 900 shown in FIG. 17A is different from the equalizer circuit 100 shown in FIG. 4A in that the equalizer circuit 900 includes two clock generation circuits (a clock generation circuit 903-1 and a clock generation circuit 903-2).

Control signals L1 to L4 generated by the clock generation circuit 903-1 are input to the IQ mixer 101, and control signals $S_1$ to $S_4$ generated by the clock generation circuit 903-2 are input to the phase-to-phase connection circuit 102.

Figure 17B:
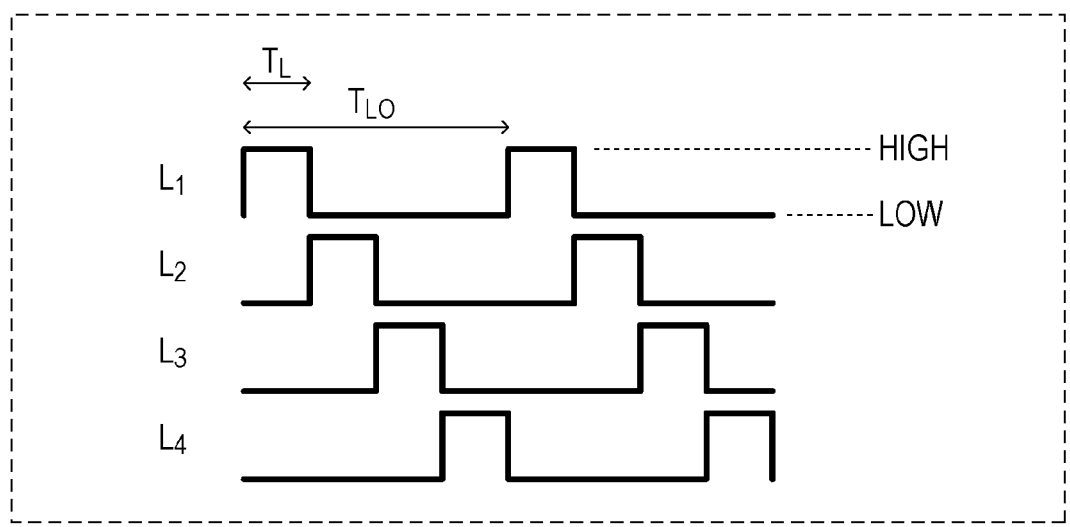
FIG. 17B is a timing chart illustrating an example of a set of control signals according to the seventh embodiment.

FIG. 17B illustrates an example of a set of waveforms of the control signals L1 to L4. Note that the control signals $S_1$ to $S_4$ have waveforms by way of example similar to those shown in FIG. 5. The control signals L1 to L4 each have a pulse width denoted by $T_L$, and the control signals L1 to L4 each have a period $T_{LO}$. The period $T_{LO}$ of the control signals L1 to L4 is $T_{LO}=T_{CK}/M$ where $T_{CK}$ is the period of the control signals $S_1$ to $S_4$ and M is a positive value.

The control signals L1 to L4 are different in frequency from the control signals $S_1$ to $S_4$. M is determined such that the clock frequency $f_{LO}$ ($f_{LO}=1/T_{LO}$) of the control signals L1 to L4 becomes equal to a carrier frequency of an RF signal by which the IQ mixer 101 converts the frequency of the RF signal so as to obtain a base band signal from the RF signal. The clock frequency $f_{CK}(f_{CK}=1/T_{CK})$ of the control signals $S_1$ to $S_4$ is determined to be several times higher than the band frequency of the baseband signal. The clock generation circuit 903-1 for the frequency conversion operates at a high frequency, but the clock generation circuit 903-2 operates at a low frequency, which makes it relatively easy to design the clock generation circuit 903-2.

The clock generation circuit 903-1 and the clock generation circuit 903-2 may be integrated into one clock generation circuit which generates both the control signals L1 to L4 and the control signals $S_1$ to $S_4$. The clock generation circuit 903-1 or 903-2 may generate control signals with dull waveforms, or may generate control signals in the form of sinusoidal waves and may adjust bias thereof. Thus the clock generation circuits 903-1 and 903-2 are capable of achieving a switch on-period corresponding to that achieved by a clock with a duty ratio of 25%.

The IQ mixer 101 performs the frequency conversion on the input signal by turning on/off the switches 1012 (1012-1 to 1012-4) (see FIG. 4B) under the control of the control signals L1 to L4, and the IQ mixer 101 outputs the resultant frequency-converted signal to the terminals T1 to T4.

The phase-to-phase connection circuit 102 turns on/off the switches 1021-1 to 1021-4 (see FIG. 4C) connected to the terminals T1 to T4 under the control of the control signals $S_1$ to $S_4$. As a result, 4-phase signals with different phases at terminals T1 to T4 are connected via the phase-to-phase capacitor 1022. The phase-to-phase connection circuit 102 mixes signals different in phase by 90° with weights, and thus it is possible to realize a complex filter characteristic. The output buffers 104-1 to 104-4 multiply the voltages at the terminals T1 to T4 by a constant factor and output the resultant voltages.

Although only one phase-to-phase connection circuit 102 is used in the configuration shown in FIG. 17A, there is no restriction on the number of phase-to-phase connection circuits 102. For example, two to four phase-to-phase connection circuits 102 may be used. To increase the number of clock phases, five or more phase-to-phase connection circuits 102 may be used.

FIG. 18 is a diagram illustrating a result of circuit simulation of the equalizer circuit 900 in terms of a frequency characteristic according to the seventh embodiment. In FIG. 18, a horizontal axis represents an output frequency and a vertical axis represents a gain. In the simulation, conditions and circuit element values are assumed that $f_{LO}$=60 GHz, $f_{CK}$=6 GHz, $g_m$=10 mS, $C_S$=50 fF, and $C_{IM}$=40 fF. As shown in FIG. 18, the equalizer circuit 900 is capable of achieving a frequency characteristic (complex filter characteristic) in which the gain peak position is shifted toward a lower frequency from the center frequency.

The clock generation circuit 903-1 for the frequency conversion operates at a high frequency, but the clock generation circuit 903-2 operates at a low frequency, which makes it relatively easy to design the clock generation circuit 903-2.

In the equalizer circuit according to any embodiment described above, a single balance or double balance mixer may be used as a switch for frequency conversion.

In the equalizer circuit according to each embodiment described above, the frequency conversion and the equalization are performed. However, when a 4-phase input signal is given, only equalization may be performed, or a frequency characteristic may be changed such that the equalizer circuit functions as a filter or an image removal mixer.

Eighth Embodiment

An eighth embodiment of the present disclosure is described below. In this eighth embodiment, unlike the first to seventh embodiments described above, the frequency conversion is not performed on the input signal. That is, in the present embodiment, the input signal is subjected to complex filtering of a CT (Continuous Time)/DT (Discrete Time) hybrid type without being subjected to the frequency conversion. That is, in the equalizer circuit according to the present embodiment, the frequency characteristic of the input 4-phase baseband signal is corrected, and the resultant corrected 4-phase baseband signal is output.

Figure 19A:
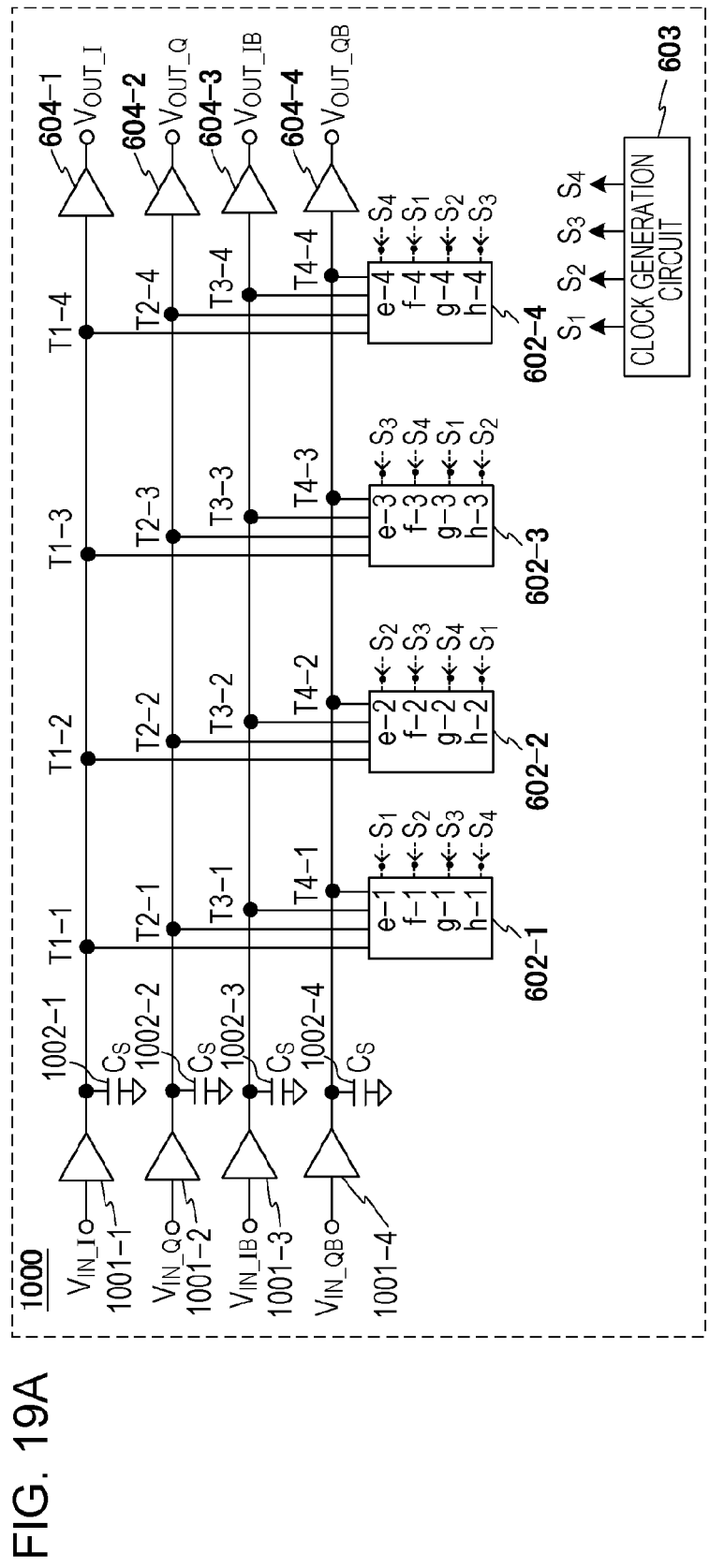
FIG. 19A is a circuit diagram illustrating an example of a circuit configuration of an equalizer circuit according to an eighth embodiment.

FIG. 19A is a diagram illustrating an example of a configuration of an equalizer circuit 1000 according to the eighth embodiment. In FIG. 19A showing the equalizer circuit 1000, similar elements to those in the equalizer circuit 600 according to the fourth embodiment shown in FIG. 12 are denoted by similar reference symbols or numerals, and a further detailed description thereof is omitted. The equalizer circuit 1000 shown in FIG. 19A is different from the equalizer circuit 600 shown in FIG. 12 (according to the fourth embodiment) is that the equalizer circuit 1000 includes, instead of the IQ mixer 601, voltage-to-current conversion circuits (TA) 1001-1 to 1001-4 and sample capacitors 1002-1 to 1002-4.

Figure 19B:
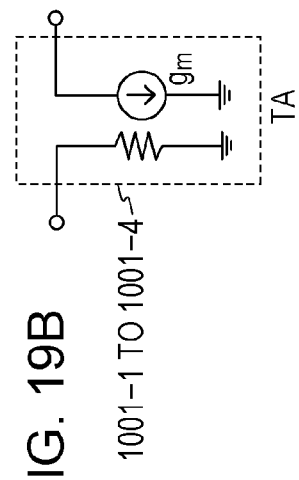
FIG. 19B is a diagram illustrating an example of a configuration of a TA according to the eighth embodiment.

For example, the TA 1001-1 to TA 1001-4 each have an ideal TA configuration such as that shown in FIG. 19B. The voltage-to-current conversion circuits (TA) 1001-1 to 1001-4 each may be implemented using one or more transistors.

The operation of the equalizer circuit 1000 is described below. 4-phase input signals (voltage signals $V_{IN\_I}$, $V_{IN\_Q}$, $V_{IN\_IB}$, and $V_{IN\_QB}$) which are different in phase by 90° are input to the TAs 1001-1 to 1001-4, and the input signals in the form of voltage signals are converted to current signals. Charges of the current signals are accumulated in the sample capacitors 1002-1 to 1002-4. The phase-to-phase connection circuits 602-1 to 602-4 are sequentially connected to the terminals T1 to T4 under the control of the control signals $S_1$ to $S_4$ such that the same connection path (terminals T1 to T4) is not connected at the same time to two or more of the phase-to-phase connection circuits 602-1 to 602-4. As a result, signals different in phase by 90° are weighted and mixed, and thus the equalizer circuit 1000 is capable of achieving a complex filter characteristic. The voltages at the terminals T1 to T4 change discontinuously when the phase-to-phase capacitor 1022 (see FIG. 4C) in the phase-to-phase connection circuit 602 is connected to the terminals T1 to T4. However, at any other moments, the changes in the voltages are continuous. The output buffers 604-1 to 604-4 multiply the voltages at the terminals T1 to T4 by a constant factor and output the resultant voltages.

Although four phase-to-phase connection circuits 602 are used in the configuration shown in FIG. 19A, there is no restriction on the number of phase-to-phase connection circuits 602. For example, one to three phase-to-phase connection circuits 602 may be used. To increase the number of clock phases five or more phase-to-phase connection circuits 602 may be used.

FIG. 20 is a diagram illustrating a result of circuit simulation of the equalizer circuit 1000 in terms of a frequency characteristic according to the eighth embodiment. In the simulation, phase differences of the respective 4-phase input signals with reference to $V_{IN\_I}$ are $V_{IN\_I}$: 0°, $V_{IN\_Q}$: −90°, $V_{IN\_IB}$: −180°, and $V_{IN\_QB}$: −270°. In FIG. 20 a horizontal axis represents an output frequency and a vertical axis represents a gain. As shown in FIG. 20, the equalizer circuit 1000 is capable of achieving a frequency characteristic (complex filter characteristic) in which the gain peak position is shifted toward a higher frequency from the center frequency. As described above, the equalizer circuit 1000 is capable of achieving a complex filter characteristic without performing a frequency conversion on an input signal.

Note that like the previous embodiments described above, it is possible to shift the gain peak position toward a higher frequency by performing sequential inputting of clocks in a reversed order.

Ninth Embodiment

In the equalizer circuit according to the eighth embodiment described above with reference to FIG. 19A, the input signal is not subjected to the frequency conversion. This configuration according to the eighth embodiment in which the input signal is not subjected to the frequency conversion may be applied to other embodiments. In a ninth embodiment of the present disclosure, as described below, the configuration in which the input signal is not subjected to the frequency conversion is applied to the equalizer circuit 700 shown in FIG. 14.

Figure 21:
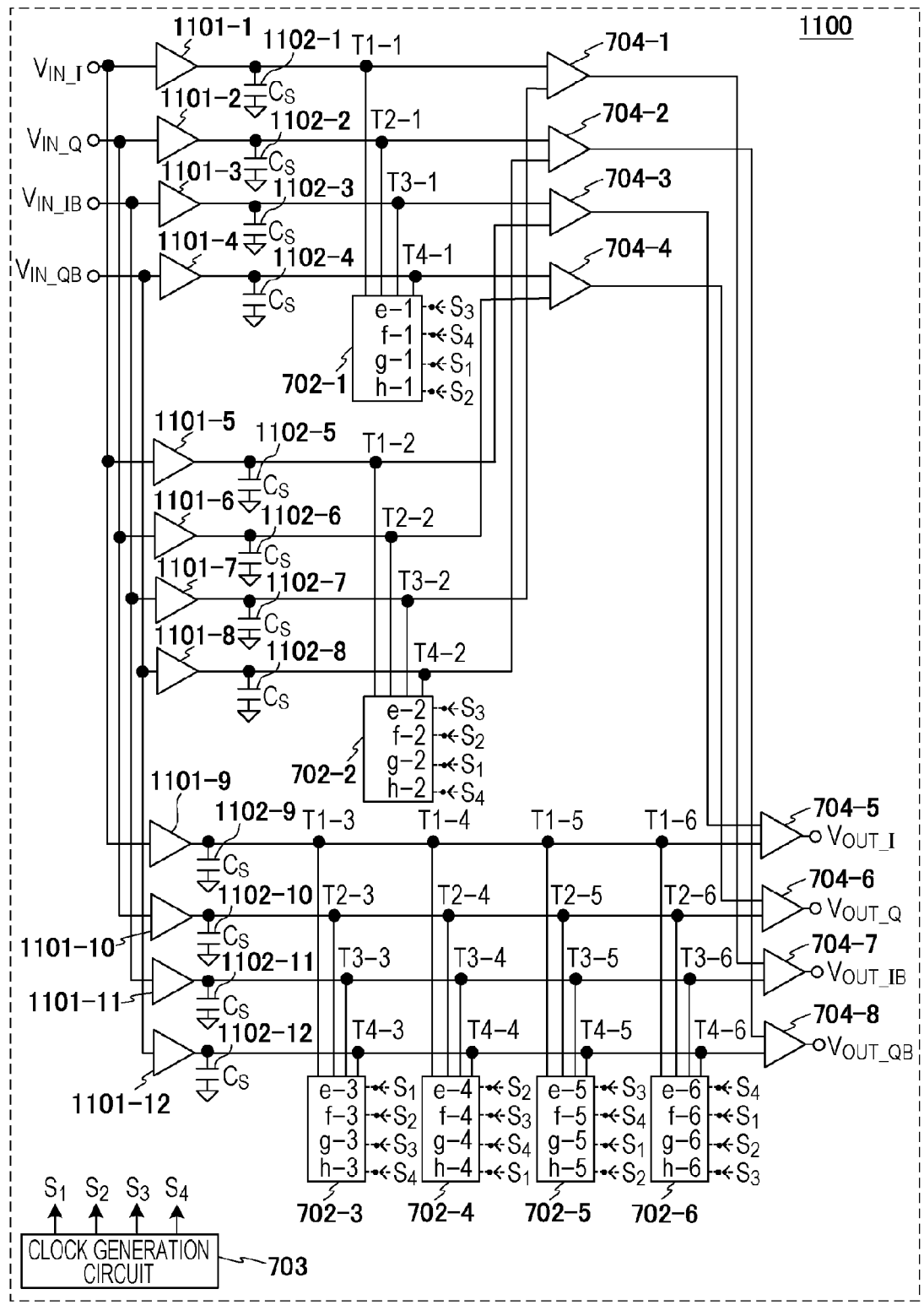
FIG. 21 is a circuit diagram illustrating an example of a circuit configuration of an equalizer circuit according to a ninth embodiment.

FIG. 21 is a diagram illustrating an example of a configuration of an equalizer circuit 1100 according to the ninth embodiment. In the equalizer circuit 1100 shown in FIG. 21, elements similar to those in the equalizer circuit 700 shown in FIG. 14 are denoted by similar reference symbols or numerals, and a further detailed description thereof is omitted. The equalizer circuit 1100 is different from the equalizer circuit 700 shown in FIG. 14 in that the equalizer circuit 1100 includes, instead of the IQ mixer 701, TA 1101-1 to TA 1101-12, and sample capacitors 1102-1 to 1102-12.

In the TAs 1101 and the sample capacitors 1102, operations on the input signal are similar to those performed in the TAs 1001 and sample capacitors 1002 according to the eighth embodiment, and thus a further detailed description thereof is omitted.

The equalizer circuit 1100 shown in FIG. 21 is configured such that a plurality of equalizer circuits 1000 shown in FIG. 19A are connected, and no frequency conversion is performed in the equalizer circuit 1100. The configuring the equalizer circuit 1100 as shown in FIG. 21 makes it possible to realize a frequency characteristic such as that shown in FIG. 15 as with the equalizer circuit 700 shown in FIG. 14 (however, the output frequency is the same as the input frequency because the frequency conversion is not performed).

The number of phase-to-phase connection circuits and the order of inputting clocks to the phase-to-phase connection circuits are not limited to those shown in FIG. 21, but they may be properly changed.

In the equalizer circuits according to the respective embodiments described above, if the frequency characteristic to be corrected changes with time, circuit element values, the number of phase-to-phase connection circuits, and the order of inputting clocks may be adaptively changed with time.

The present disclosure has been described above with reference to embodiments, which may be summarized as follows. As described above, in a first aspect of the present disclosure, an equalizer circuit includes one or more phase-to-phase connection circuitry each including an phase-to-phase capacitor and first, second, third, and fourth phase-to-phase switches, one terminal of each of the first, second, third, and fourth phase-to-phase switches being connected to a corresponding one of first, second, third, and fourth connection paths to which first, second, third, and fourth converted signals are respectively input, the first, second, third, and fourth converted signals being generated by converting an input signal, the first, second, third, and fourth converted signals being different in phase by 90° from one converted signal to a next converted signal, the phase-to-phase capacitor being connected to the other one terminal of each of the first, second, third, and fourth phase-to-phase switches;

control signal generation circuitry that generates, by converting a reference signal with a particular frequency, 4-phase control signals being different in phase by 90° from one control signal to a next control signal for controlling turning-on/off of the first, second, third, and fourth phase-to-phase switches and outputs the 4-phase control signals respectively to the first, second, third, and fourth phase-to-phase switches; and first, second, third, and fourth output buffers that are respectively connected to the first, second, third, and fourth connection paths and that respectively output 4-phase output signals, wherein a closing of the first, second, third, and fourth phase-to-phase switches are started from any one of phase-to-phase switches in a first order based on the 4-phase control signals, and the first order is a first ascending circulation of the first, the second, the third, and the fourth phase-to-phase switch or a first descending circulation of the fourth, the third, the second, and the first phase-to-phase switch.

In a second aspect of the present disclosure based on the first aspect, the equalizer circuit includes one or more conversion circuitry that respectively generates the first, second, third, and fourth converted signals, the one or more conversion circuitry each including voltage-to-current conversion circuitry that converts the input signal to a current signal, and first, second, third, and fourth sample switches connected that one end of each sample switches is connected to an output node of the voltage-to-current conversion circuitry and the other end of each sample switches is connected to a corresponding one of the first, second, third, and fourth connection paths, and first, second, third, and fourth sample capacitors connected that one end of each sample capacitors is connected to a corresponding one of the first, second, third, and fourth connection paths, and the other end of each sample capacitors is grounded, wherein a closing of the first, second, third, and fourth sample switches started from any one of sample switches in a second order based on the 4-phase control signals, and the second order is a second ascending circulation of the first, the second, the third, and the fourth sample switch or a second descending circulation of the fourth, the third, the second, and the first sample switch.

In the equalizer circuit in a third aspect of the present disclosure based on the first aspect, the one or more phase-to-phase connectors are each connected in parallel to the first, second, third, and fourth connection paths, and the timing of turning on the first phase-to-phase switch located in each of the respective one or more phase-to-phase connectors is different among the one or more phase-to-phase connectors.

In the equalizer circuit in a fourth aspect of the present disclosure based on the second aspect, the one or more conversion circuitry are provided in parallel, the one or more phase-to-phase connection circuitry are respectively connected to the one or more conversion circuitry, the connection order in each of the one or more phase-to-phase connectors respectively connected to the one or more conversion circuitry is different among the one or more phase-to-phase connection circuitry, and each of the output buffers is connected to one or more of the first, second, third, and fourth connection paths that signals with opposite phases output from the one or more conversion circuitry are obtained on the one or more of the first, second, third, and fourth connection paths, and each of the output buffers outputs a difference between the signals output from the one or more conversion circuitry.

In the equalizer circuit in a fifth aspect of the present disclosure based on the second aspect, the one or more conversion circuitry are provided in parallel, the one or more phase-to-phase connection circuitry are respectively connected to the one or more conversion circuitry, the connection order in each of the one or more phase-to-phase connectors respectively connected to the one or more conversion circuitry is different among the one or more phase-to-phase connection circuitry, and each of the output buffers is connected to one or more of the first, second, third, and fourth connection paths that signals in phase output from the one or more conversion circuitry are obtained on the one or more of the first, second, third, and fourth connection paths, and each of the output buffers outputs a sum of the signals output from the one or more conversion circuitry.

In a sixth aspect of the present disclosure, a reception apparatus includes
equalizer circuitry,
analog-to-digital conversion circuitry that converts a signal output from the equalizer circuitry to a digital signal, and
digital reception processing circuitry that performs reception processing on the digital signal and outputs a result as reception data,
the equalizer circuitry including
one or more phase-to-phase connection circuitry each including an phase-to-phase capacitor and first, second, third, and fourth phase-to-phase switches, one terminal of each of the first, second, third, and fourth phase-to-phase switches being connected to a corresponding one of first, second, third, and fourth connection paths to which first, second, third, and fourth converted signals are respectively input, the first, second, third, and fourth converted signals being generated by converting an input signal, the first, second, third, and fourth converted signals being different in phase by 90° from one converted signal to a next converted signal, the phase-to-phase capacitor being connected to the other one terminal of each of the first, second, third, and fourth phase-to-phase switches,
control signal generation circuitry that generates, by converting a reference signal with a particular frequency, 4-phase control signals being different in phase by 90° from one control signal to a next control signal for controlling turning-on/off of the first, second, third, and fourth phase-to-phase switches and outputs the resultant 4-phase control signals respectively to the first, second, third, and fourth phase-to-phase switches, and
first, second, third, and fourth output buffers that are respectively connected to the first, second, third, and fourth connection paths and that respectively output 4-phase output signals,
wherein a closing of the first, second, third, and fourth phase-to-phase switches are started from any one of phase-to-phase switches in a first order based on the 4-phase control signals, and
the first order is a first ascending circulation of the first, the second, the third, and the fourth phase-to-phase switch or a first descending circulation of the fourth, the third, the second, and the first phase-to-phase switch.

The present disclosure is useful for use in a signal processing circuit that processes a high-frequency signal and a baseband signal in a wireless communication apparatus, and more specifically, useful for use in filtering, equalizing, frequency conversion, and/or the like.

What is claimed is:

1. An equalizer circuit comprising:
   a plurality of phase-to-phase connection circuitries, each phase-to-phase connection circuitry including a phase-to-phase capacitor and first, second, third, and fourth phase-to-phase switches, one terminal of each of the first, second, third, and fourth phase-to-phase switches connected to a corresponding one of first, second, third, and fourth connection paths to which first, second, third, and fourth converted signals are respectively input, the first, second, third, and fourth converted signals generated by converting an input signal, the first, second, third, and fourth converted signals being different in phase by 90° from one converted signal to a next converted signal, the phase-to-phase capacitor connected to another terminal of each of the first, second, third, and fourth phase-to-phase switches;
   a control signal generation circuit that generates, by converting a reference signal with a particular frequency, 4-phase control signals being different in phase by 90° from one control signal to a next control signal for controlling turning-on/off of the first, second, third, and fourth phase-to-phase switches and outputs the 4-phase control signals respectively to the first, second, third, and fourth phase-to-phase switches; and
   first, second, third, and fourth output buffers that are respectively connected to the first, second, third, and fourth connection paths and that respectively output 4-phase output signals,
   wherein a closing of the first, second, third, and fourth phase-to-phase switches is started from any one of phase-to-phase switches in a first order based on the 4-phase control signals,
   the first order is a first ascending circulation of the first, the second, the third, and the fourth phase-to-phase switches or a first descending circulation of the fourth, the third, the second, and the first phase-to-phase switches,
   each of the first, second, third, and fourth connection paths is connected to at least two of the plurality of phase-to-phase connection circuitries, and
   the timing of turning on the first phase-to-phase switch located in each of the respective phase-to-phase connection circuitries is different among the respective phase-to-phase connection circuitries.

2. An equalizer circuit comprising:
   a plurality of phase-to-phase connection circuitries, each phase-to-phase connection circuitry including a phase-to-phase capacitor and first, second, third, and fourth phase-to-phase switches, one terminal of each of the first, second, third, and fourth phase-to-phase switches connected to a corresponding one of first, second, third, and fourth connection paths to which first, second, third, and fourth converted signals are respectively input, the first, second, third, and fourth converted signals generated by converting an input signal, the first, second, third, and fourth converted signals being different in phase by 90° from one converted signal to a next converted signal, the phase-to-phase capacitor connected to another terminal of each of the first, second, third, and fourth phase-to-phase switches;
   a control signal generation circuit that generates, by converting a reference signal with a particular frequency, 4-phase control signals being different in phase by 90° from one control signal to a next control signal for controlling turning-on/off of the first, second, third, and fourth phase-to-phase switches and outputs the 4-phase control signals respectively to the first, second, third, and fourth phase-to-phase switches;
   first, second, third, and fourth output buffers that are respectively connected to the first, second, third, and fourth connection paths and that respectively output 4-phase output signals; and
   one or more conversion circuitries respectively generating the first, second, third, and fourth converted signals,
   wherein,
   a closing of the first, second, third, and fourth phase-to-phase switches is started from any one of phase-to-phase switches in a first order based on the 4-phase control signals,
   the first order is a first ascending circulation of the first, the second, the third, and the fourth phase-to-phase switches or a first descending circulation of the fourth, the third, the second, and the first phase-to-phase switches, and wherein each conversion circuitry of the one or more conversion circuitries includes:

a voltage-to-current conversion circuit that converts the input signal to a current signal, first, second, third, and fourth sample switches connected such that one end of each sample switch is connected to an output node of the voltage-to-current conversion circuit and another end of each sample switch is connected to a corresponding one of the first, second, third, and fourth connection paths, and first, second, third, and fourth sample capacitors connected such that one end of each sample capacitor is connected to a corresponding one of the first, second, third, and fourth connection paths, and another end of each sample capacitor is grounded, wherein a closing of the first, second, third, and fourth sample switches is started from any one of the sample switches in a second order based on the 4-phase control signals, and the second order is a second ascending circulation of the first, the second, the third, and the fourth sample switches or a second descending circulation of the fourth, the third, the second, and the first sample switches.

3. The equalizer circuit according to claim 2, wherein the one or more conversion circuitries are provided in parallel, the plurality of phase-to-phase connection circuitries are respectively connected to the one or more conversion circuitries, the connection order in each of the one or more phase-to-phase connectors respectively connected to the one or more conversion circuitries is different among the plurality of phase-to-phase connection circuitries, and each of the output buffers is connected to one or more of the first, second, third, and fourth connection paths such that signals with opposite phases output from the one or more conversion circuitries are obtained on the one or more of the first, second, third, and fourth connection paths, and each of the output buffers outputs a difference between the signals output from the one or more conversion circuitries.

4. The equalizer circuit according to claim 2, wherein the one or more conversion circuitries are provided in parallel, the plurality of phase-to-phase connection circuitries are respectively connected to the one or more conversion circuitries, the connection order in each of the one or more phase-to-phase connectors respectively connected to the one or more conversion circuitries is different among the plurality of phase-to-phase connection circuitries, and each of the output buffers is connected to one or more of the first, second, third, and fourth connection paths such that signals in phase output from the one or more conversion circuitries are obtained on the one or more of the first, second, third, and fourth connection paths, and each of the output buffers outputs a sum of the signals output from the one or more conversion circuitries.

5. A reception apparatus comprising:

an equalizer circuit, an analog-to-digital conversion circuit that converts a signal output from the equalizer circuit to a digital signal, and a digital reception processing circuit that performs reception processing on the digital signal and outputs a result as reception data, the equalizer circuit including a plurality of phase-to-phase connection circuitries, each phase-to-phase connection circuitry including a phase-to-phase capacitor and first, second, third, and fourth phase-to-phase switches, one terminal of each of the first, second, third, and fourth phase-to-phase switches connected to a corresponding one of first, second, third, and fourth connection paths to which first, second, third, and fourth converted signals are respectively input, the first, second, third, and fourth converted signals generated by converting an input signal, the first, second, third, and fourth converted signals being different in phase by 90° from one converted signal to a next converted signal, the phase-to-phase capacitor connected to another terminal of each of the first, second, third, and fourth phase-to-phase switches, a control signal generation circuit that generates, by converting a reference signal with a particular frequency, 4-phase control signals being different in phase by 90° from one control signal to a next control signal for controlling turning-on/off of the first, second, third, and fourth phase-to-phase switches and outputs the resultant 4-phase control signals respectively to the first, second, third, and fourth phase-to-phase switches, one or more conversion circuitries respectively generating the first, second, third, and fourth converted signals, and first, second, third, and fourth output buffers that are respectively connected to the first, second, third, and fourth connection paths and that respectively output 4-phase output signals, wherein, a closing of the first, second, third, and fourth phase-to-phase switches is started from any one of phase-to-phase switches in a first order based on the 4-phase control signals, the first order is a first ascending circulation of the first, the second, the third, and the fourth phase-to-phase switches or a first descending circulation of the fourth, the third, the second, and the first phase-to-phase switches, and wherein each conversion circuitry of the one or more conversion circuitries includes:

a voltage-to-current conversion circuit that converts the input signal to a current signal, first, second, third, and fourth sample switches connected such that one end of each sample switch is connected to an output node of the voltage-to-current conversion circuit and another end of each sample switch is connected to a corresponding one of the first, second, third, and fourth connection paths, and first, second, third, and fourth sample capacitors connected such that one end of each sample capacitor is connected to a corresponding one of the first, second, third, and fourth connection paths, and another end of each sample capacitor is grounded, wherein a closing of the first, second, third, and fourth sample switches is started from any one of the sample switches in a second order based on the 4-phase control signals, and the second order is a second ascending circulation of the first, the second, the third, and the fourth sample switches or a second descending circulation of the fourth, the third, the second, and the first sample switches.

6. An equalizer circuit comprising:

first, second, third, and fourth voltage-to-current conversion circuitries connected to first, second, third, and fourth connection paths respectively converting first, second, third, and fourth converted signals to first, second, third, and fourth current signals, the first, second, third, and fourth converted signals being different in phase by 90° from one converted signal to a next converted signal;

first, second, third and fourth sample capacitors connected such that one end of each sample capacitor is connected to a corresponding one of the first, second, third and fourth connection paths and another end of each sample capacitor is grounded;

a plurality of phase-to-phase connection circuitries, each phase-to-phase connection circuitry including a phase-to-phase capacitor and first, second, third, and fourth phase-to-phase switches, one terminal of each of the first, second, third, and fourth phase-to-phase switches connected to a corresponding one of the first, second, third, and fourth connection paths to which the first, second, third, and fourth current signals are respectively input, the phase-to-phase capacitor connected to another terminal of each of the first, second, third, and fourth phase-to-phase switches;

a control signal generation circuit that generates, by converting a reference signal with a particular frequency, 4-phase control signals being different in phase by 90° from one control signal to a next control signal for controlling turning-on/off of the first, second, third, and fourth phase-to-phase switches and outputs the 4-phase control signals respectively to the first, second, third, and fourth phase-to-phase switches; and first, second, third, and fourth output buffers that are respectively connected to the first, second, third, and fourth connection paths and that respectively output 4-phase output signals;

wherein, a closing of the first, second, third, and fourth phase-to-phase switches is started from any one of phase-to-phase switches in a first order based on the 4-phase control signals, the first order is a first ascending circulation of the first, the second, the third, and the fourth phase-to-phase switches or a first descending circulation of the fourth, the third, the second, and the first phase-to-phase switches, each of the first, second, third, and fourth connection paths is connected to at least two of the plurality of phase-to-phase connection circuitries, and the timing of turning on the first phase-to-phase switch located in each of the respective phase-to-phase connection circuitries is different among the respective phase-to-phase connection circuitries.

\* \* \* \* \*